United States Patent [19]
Hohmoto et al.

[11] Patent Number: 5,693,934
[45] Date of Patent: Dec. 2, 1997

[54] LUMINANCE DETECTING CIRCUIT IN WHICH PLURAL PHOTOINDUCED CURRENTS ARE AMPLIFIED AND COMBINED ONTO A COMMON CURRENT CONDUCTOR

[75] Inventors: Tatsuya Hohmoto; Hiroshi Murakami; Kunihiko Karasawa; Hideo Hara, all of Tokyo, Japan

[73] Assignees: Mitsubishi Denki Kabushiki Kaisha; Mitsubishi Electric Engineering Co., Ltd., both of Tokyo, Japan

[21] Appl. No.: 578,969

[22] Filed: Dec. 27, 1995

[30] Foreign Application Priority Data

Aug. 18, 1995 [JP] Japan ................................ 7-210610

[51] Int. Cl.$^6$ ............................................ H01J 40/14
[52] U.S. Cl. ............................ 250/214 A; 250/214 R; 330/110
[58] Field of Search ................ 250/214 A, 214 R; 327/514, 515, 103; 330/59, 110, 308

[56] References Cited

U.S. PATENT DOCUMENTS

| | | | |
|---|---|---|---|
| 5,111,156 | 5/1992 | Hachiuma | 330/308 |
| 5,214,527 | 5/1993 | Chang et al. | 250/214 A |
| 5,515,260 | 5/1996 | Watanabe et al. | 363/73 |

*Primary Examiner*—Edward P. Westin
*Assistant Examiner*—Kevin Pyo
*Attorney, Agent, or Firm*—Oblon, Spivak, McClelland, Maier & Neustadt, P.C.

[57] ABSTRACT

Photocurrents outputted by photo detecting circuits ($1_1$ to $1_n$) disposed in first current paths ($2_1$ to $2_n$) are amplified by current amplifying means ($3_1$ to $3_n$) disposed in the first current paths ($2_1$ to $2_n$), respectively. The output currents from the plurality of current amplifying means ($3_1$ to $3_n$) are converted into voltage all by one current-voltage converting means (5). The current amplifying means ($3_1$ to $3_n$) are turned on or off by control signals ($3_{1S}$ to $3_{nS}$), and therefore the luminance detecting circuit amplifies the current of the required photo detecting element only, and outputs into the current-voltage converting means (5).

13 Claims, 13 Drawing Sheets

LUMINANCE DETECTING CIRCUIT IN WHICH PLURAL PHOTOINDUCED CURRENTS ARE AMPLIFIED AND COMBINED ONTO A COMMON CURRENT CONDUCTOR

BACKGROUND OF THE INVENTION

1. Field of the Invention

The present invention relates to a luminance detecting circuit for amplifying a current generated by a photo detecting element depending on the quantity of incident light, and convening current into voltage, and more particularly to a luminance detecting circuit using a multi-division sensor assigning a plurality of photo detecting elements on a plurality of divided receptor surfaces, and selecting a photo detecting element for detecting the luminance by a switch.

2. Description of the Background Art

FIG. 21 is a circuit diagram showing a conventional luminance detecting circuit of multi-division type. In the diagram, reference numeral $100_i$ is an operational amplifier having an output terminal connected to an output terminal $104i$ of the luminance detecting circuit, $101_i$ is a photo detecting element having an anode terminal connected to an inverting input terminal of the operational amplifier $100_i$ and a cathode terminal connected to a non-inverting input terminal of the operational amplifier $100_i$ and reference voltage (Vref), and $102i$ is a diode having an anode terminal connected to the inverting input terminal of the operational amplifier $100_i$ and anode terminal of the photo detecting element $101_i$, and a cathode terminal connected to the output terminal of the operational amplifier $100_i$. The subscript of the reference numerals shown in FIG. 21 denotes the part corresponding to the photo detecting element of the same subscript. The photo detecting element includes, for example, a photocell, the photocell includes, for example, a silicon receptor, and the silicon receptor includes, for example, a photodiode or phototransistor.

When a reference voltage Vref is applied to photo detecting elements $101_1$ to $101_n$, the photo detecting elements $101_1$ to $101_n$ generate photovoltaic currents depending on the incident light. Since the photo detecting elements $101_1$ to $101_n$ are arranged in a predetermined current path, a photocurrent is generated in the current path. The currents $I_{x1}$ to $I_{xn}$ generated by the photo detecting elements $101_1$ to $101_n$ flow into diodes $102_1$ to $102_n$ connected in series to the corresponding photo detecting elements $101_1$ to $101_n$ respectively, and voltages $V_{be1}$ to $V_{ben}$ having a value equal to the logarithm of the values of the current $I_{x1}$ to $I_{xn}$ are generated across both ends of each one of the diodes $102_1$ to $102_n$. The relation between the voltages $V_{be1}$ to $V_{ben}$ generated across both ends of the diodes $102_1$ to $102_n$ and currents $I_{x1}$ to $I_{xn}$ is shown in formula 1.

$$V_{be} = \frac{kT}{q} \ln \frac{Ix}{Is} \quad (1)$$

where q: absolute value of electric charge of electron
k: Boltzmann's constant
T: temperature of diode
Is: saturation current The inverting input terminals of the operational amplifiers $100_1$ to $100_n$ form imaginary short circuits with their non-inverting input terminals, and the voltage of the inverting input terminals of the operational amplifiers $100_1$ to $100_n$ is nearly equal to the reference voltage Vref. Accordingly, at the output terminals of the operational amplifiers $100_1$ to $100_n$, voltages got by subtracting voltages generated across both ends of the diodes $102_1$ to $102_n$ connected between the output terminal and its inverting input terminal from the reference voltage $V_{ref}$ are outputted. The output voltage $V_{out}$ of the operational amplifier at this time is shown in formula 2.

$$V_{out} = V_{ref} - \frac{kT}{q} \ln \frac{I}{Is} \quad (2)$$

By converting from current into voltage in this manner, the differences between the output voltages $V_{out}$ and reference voltage $V_{ref}$, that is, the voltages logarithmically converted by the diodes $102_1$ to $102_n$ are determined, and the luminance is detected.

FIG. 22 shows five photo detecting elements $105_1$ to $105_5$ disposed on a plane. In the case of use of photo detecting elements $105_1$ to $105_5$ by multi-division mechanism, there is one operational amplifier for one photo detecting element, and hence five current-voltage converting circuits are needed for five photo detecting elements $105_1$ to $105_5$. Such current-voltage converting circuits and photo detecting circuits are integrated on one chip, and a luminance detecting circuit is composed.

The conventional luminance detecting circuit is constituted as described above, and the photocurrent generated by the photo detecting element is used as input current, and is directly fed into the diode to convert from current into voltage, and hence when the current is very feeble (several pA to scores of pA), the effect is serious even by a small noise of the operational amplifiers or the like. Accordingly, in the conventional luminance detecting circuit, the current-voltage conversion by feeble current is difficult, and the photocurrent is generated in proportion to the area of the photo detecting element, and therefore in order to keep the input current above a certain level, a photo detecting element having a certain big capacity is needed. In the existing photo detecting element, the rate to the chip area is high, and it leads to increase of the chip size and hence increase of cost. Besides, using the sensor with multi-division constitution, one operational amplifier is used for one sensor, and hence the circuit scale is large, and hence the chip size increases and thereby the manufacturing cost is raised.

SUMMARY OF THE INVENTION

A first aspect of the present invention relates to a luminance detecting circuit comprising a plurality of first current paths, a plurality of photo detecting elements disposed in the plurality of first current paths, respectively, for generating photocurrents in the plurality of first current paths by reacting to incident light, a single second current path, a plurality of current amplifying means disposed in the plurality of first current paths, respectively, each having an input terminal connected in series to corresponding one of the plurality of photo detecting elements, and an output terminal connected to the second current path, for amplifying the photocurrent generated by corresponding one of the plurality of photo detecting elements, with being on/off controlled in response to a control signal, and outputting an amplified current to the second current path, and current-voltage converting means connected to the second current path, for converting a current flowing in the second current path into a voltage.

A second aspect of the present invention relates to a luminance detecting circuit of the first aspect, wherein each of the plurality of current amplifying means comprises a first bipolar transistor of a predetermined conductive type having one current electrode to be provided with a predetermined voltage, other current electrode connected to the corresponding photo detecting element, and a control electrode to be provided with a voltage corresponding to the other current electrode, a second bipolar transistor of the predetermined conductive type having one current electrode to be provided with the predetermined voltage, other current electrode connected to the current path, and a control electrode connected to the control electrode of the first bipolar transistor, and switch means having one end connected to the control electrode of the first bipolar transistor, and other end to be provided with the predetermined voltage, for being controlled to be in conduction or non-conduction in response to the control signal.

A third aspect of the present invention relates to a luminance detecting circuit of the first aspect, wherein each of the plurality of current amplifying means respectively comprise a bipolar transistor having one current electrode to be provided with a predetermined voltage, a control electrode connected to the corresponding photo detecting element, and other current electrode connected to the second current path, and switch means having one end connected to the control electrode and other end to be provided with the predetermined voltage, for being controlled to be in conduction or non-conduction in response to the control signal.

A fourth aspect of the present invention relates to a luminance detecting circuit comprising a plurality of first current paths, a plurality of photo detecting elements disposed in the plurality of first current paths, respectively, for generating photocurrents in the plurality of first current paths by reacting to incident light, a single second current path connected with the plurality of first current paths, respectively, each of the plurality of switch means disposed in the plurality of first current paths, for controlling on/off of a current flowing into the second current path from corresponding one of the plurality of first current paths, current amplifying means connected to the second current path, for amplifying and outputting a current flowing the second current path, and current-voltage converting means connected to the current amplifying means, for converting the current outputted by the current amplifying means into a voltage.

A fifth aspect of the present invention relates to a luminance detecting circuit of the fourth aspect, wherein the current amplifying means comprises a first bipolar transistor of a predetermined conductive type having one current electrode to be provided with a predetermined voltage, other current electrode connected to the second current path, and a control electrode to be provided with a voltage corresponding to the other current electrode, and a second bipolar transistor of a predetermined conductive type having one current electrode to be provided with the predetermined voltage, other current electrode connected to the current-voltage converting means, and a control electrode connected to the control electrode of the first bipolar transistor.

A sixth aspect of the present invention relates to a luminance detecting circuit of the fourth aspect, wherein the current amplifying means comprises a bipolar transistor having one current electrode to be provided with a predetermined voltage, a control electrode connected to the second current path, and other current electrode connected to the current-voltage converting means.

A seventh aspect of the present invention relates to a luminance detecting circuit comprising a plurality of photo detecting elements disposed in a plurality of first current paths, respectively, for generating photocurrents in the plurality of first current paths by reacting to incident light, a single second current path, a plurality of switch means having one ends connected to the plurality of first current paths, respectively, and other ends connected to the second current path, for controlling on/off of currents flowing from the first current paths into the second current path, and current-voltage converting means connected to the second current path, for converting a current flowing in the second current path into a voltage.

It is therefore an object of the present invention to curtail the cost by reducing the chip size in order to solve the problems of the prior art.

These and other objects, features, aspects and advantages of the present invention will become more apparent from the following description of the present invention when taken in conjunction with the accompanying drawings.

DESCRIPTION OF THE PREFERRED EMBODIMENTS

<First Preferred Embodiment>

Figure 1:
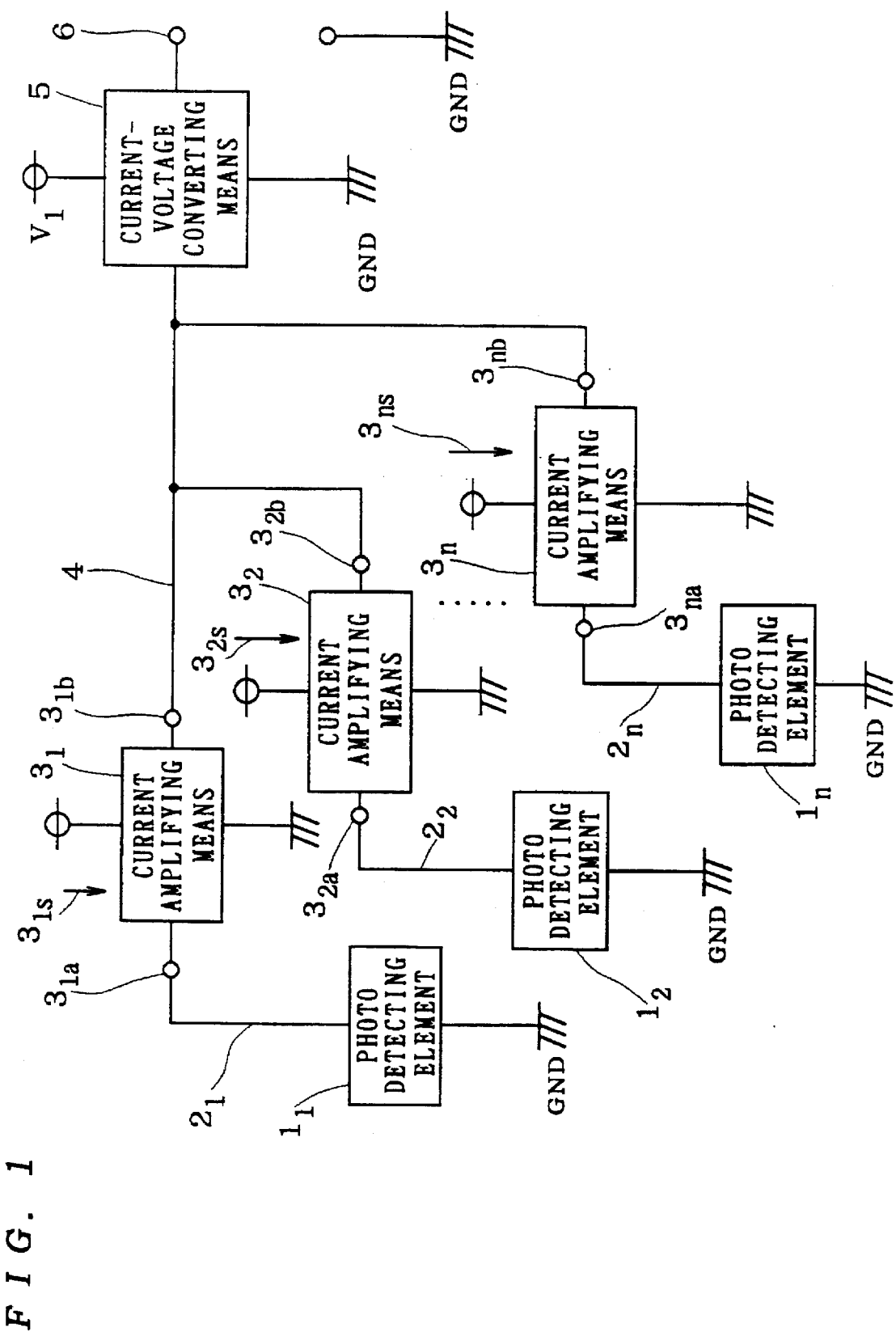
FIG. 1 is a block diagram showing a constitution of first preferred embodiment of a luminance detecting circuit of the invention.

A luminance detecting circuit in preferred first embodiment of the invention is described below by referring to accompanying drawings. FIG. 1 is a block diagram showing a constitution of the luminance detecting circuit in first preferred embodiment of the invention. In FIG. 1, reference numeral $1_i$ denotes a photo detecting element disposed in a first current path $2_i$, for generating a photocurrent in the first current path $2_i$ by reacting to incident light, $3_i$ is current amplifying means having an input $3_{ia}$ connected in series to the photo detecting element $1_i$ in the first current path $2_i$, and an output $3_{ib}$ connected to a second current path 4, for amplifying the photocurrent generated by the photo detecting element $1_i$ in the first current path $2_i$, controlling on/off depending on a given control signal $3_{iS}$, and outputting the amplified current to the second current path 4, and 5 is current-voltage converting means connected to the second current path 4, for converting the current flowing into the second current path 4 into a voltage, and outputting from an output terminal 6.

The current-voltage converting means 5 is disposed commonly to a plurality of photo detecting elements $1_1$ to $1_n$ and a plurality of current amplifying means $3_1$ to $3_n$. This is possible because the plurality of current amplifying means $3_1$ to $3_n$ amplify the photocurrents generated by the corresponding a plurality of photo detecting elements $1_1$ to $1_n$, and all output currents of a plurality of current amplifying means $3_1$ to $3_n$ flow in the second current path 4. The current-voltage converting means 5 converts the current flowing in the second current path 4 into a voltage, by controlling on/off the outputs of the plurality of current amplifying means $3_1$ to $3_n$ individually by the control signals $3_{1S}$ to $3_{nS}$, thus the sum of necessary output currents out of the photo detecting elements $1_1$ to $1_n$ can be converted into a voltage and outputted from the output terminal 6. Since the current-voltage converting means 5 is provided commonly to the plurality of photo detecting elements $1_1$ to $1_n$, the circuit scale can be reduced, and the chip size can be reduced, so that the cost can be curtailed.

Figure 2:
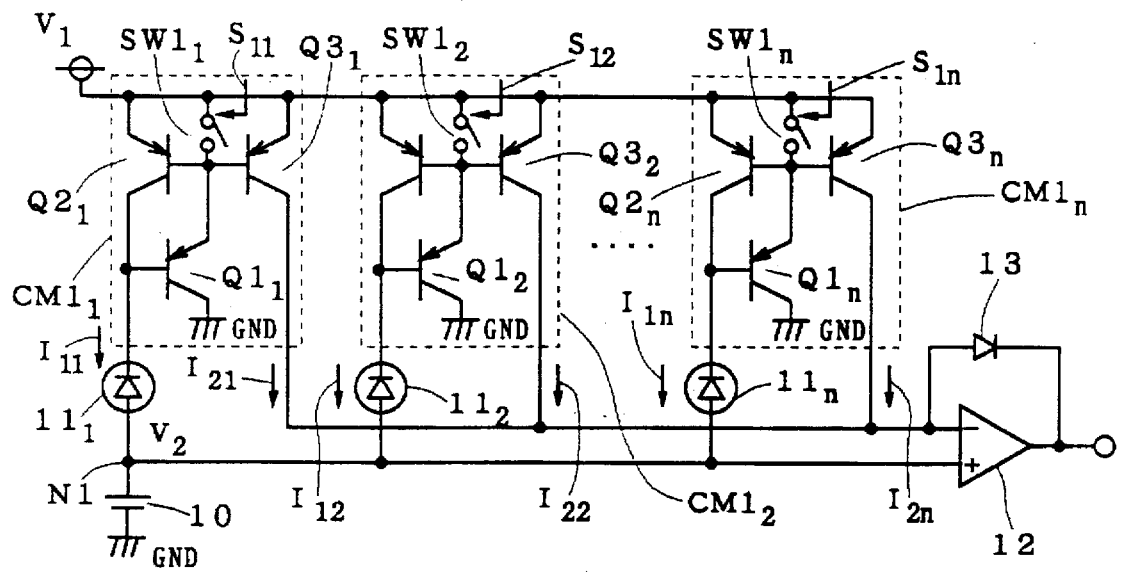
FIG. 2 is a circuit diagram showing a first mode of first preferred embodiment of a luminance detecting circuit of the invention.

A first mode of first preferred embodiment of the invention is described by referring to FIG. 2. FIG. 2 is a circuit diagram showing a constitution of the luminance detecting circuit of the first mode. In FIG. 2, reference numeral 10 is a reference power source having one end to be provided with a ground voltage and another end connected to a node N1, for providing the node N1 with a second voltage $V_2$, $11_i$ is a silicon photodiode (hereinafter SPD) having a cathode and an anode connected to the node N1, $Ql_i$ is a PNP transistor having an emitter, a collector to be provided with a ground voltage, and a base connected to the cathode of SPD $11_i$, $Q2_i$ is a PNP transistor having a collector connected to the base of the transistor $Q1_i$, an emitter to be provided with a first voltage $V_1$, and a base connected to the emitter of the transistor $Q1_i$, $Q3_i$ is a PNP transistor having a collector, an emitter to be provided with a first voltage $V_1$, and a base connected to the base of the transistor $Q2_i$, $SW1_i$ is a switch having one end to be provided with a first voltage $V_1$ and another end connected to the base of the transistor $Q2_i$, for controlling on/off depending on a given control signal $S1_i$, 12 is an operational amplifier having an inverting input terminal connected commonly to the collectors of the transistors $Q3_1$ to $Q3_n$, a non-inverting input terminal to be provided with a second voltage $V_2$, and an output terminal for outputting a potential difference between its inverting input terminal and its non-inverting input terminal, and 13 is a diode having a cathode connected to the output terminal of the operational amplifier 12 and an anode connected to the inverting input terminal of the operational amplifier 12.

A current mirror circuit $CM1_i$ is composed of transistor $Q1_i$, transistor $Q2_i$, transistor $Q3_i$, and switch $SW1_i$. Herein, the subscript i used in the description of the preferred embodiments of the invention denotes an arbitrary integer within 1 to n. In the current mirror circuit $CM1_i$, the collector of the transistor $Q2_i$ corresponds to the input terminal, and the collector of the transistor $Q3_i$ corresponds to the output terminal.

The operation is described below. Depending on the incident light, the SPD $11_i$ generates each photocurrent $I_{1i}$. The generated current $I_{1i}$ is put into the input terminal of the current mirror circuit $CM1_i$, and the current $I_{2i}$ multiplied by n times by the current amplifying characteristic of the current mirror circuit $CM1_i$ is put out of the output terminal. All currents $I_{21}$ to $I_{2n}$ outputted from the current mirror circuits $CM1_1$ to $CM1_n$ flow into the diode 13, and a voltage $V_{be}$ having a value equivalent to the logarithm of the sum of the currents $I_{21}$ to $I_{2n}$ is generated at both ends of the diode 13.

$$V_{be} = \frac{kT}{q} \ln \frac{\sum_{i=1}^{n} Ii}{Is} \quad (3)$$

At the output terminal of the operational amplifier 12, a voltage $V_{out}$ got by subtracting the voltage generated across both ends of the diode 13 from the second voltage $V_2$ is generated.

$$V_{out} = V_2 - \frac{kT}{q} \quad (4)$$

Thus converting from the current to a voltage, the potential difference of the output voltage $V_{out}$ and the second voltage, that is, the voltage due to the diode 13 is determined, and the luminance is detected. The current mirror $CM1_i$ is controlled on/off by the control signal $S_{1i}$, and by opening the switch only when it is necessary to output the current of $SPD11_i$, the transistors $Q2_i$, $Q3_i$ can be operated to output the amplified current from the current mirror circuit. When not necessary to output the current from the current mirror circuit $CM1_i$, by closing the switch, the transistors $Q2_i$, $Q3_i$ are turned off, and the output current from the current mirror circuit $CM1_i$ is eliminated to zero.

Moreover, by using the current mirror circuit $CM1_1$ to $CM1_n$ capable of controlling on/off, in a multi-division sensor, the operational amplifier 12 and diode 13 for composing the current-voltage converting means can be shared. Accordingly, the circuit scale of the luminance detecting circuit can be reduced, and the chip size can be contracted, and the cost is curtailed. Besides, if the number of SPDs to be connected varies depending on the object of measurement, the current amplification is stable and easy by using the current mirror circuit.

Figure 3:
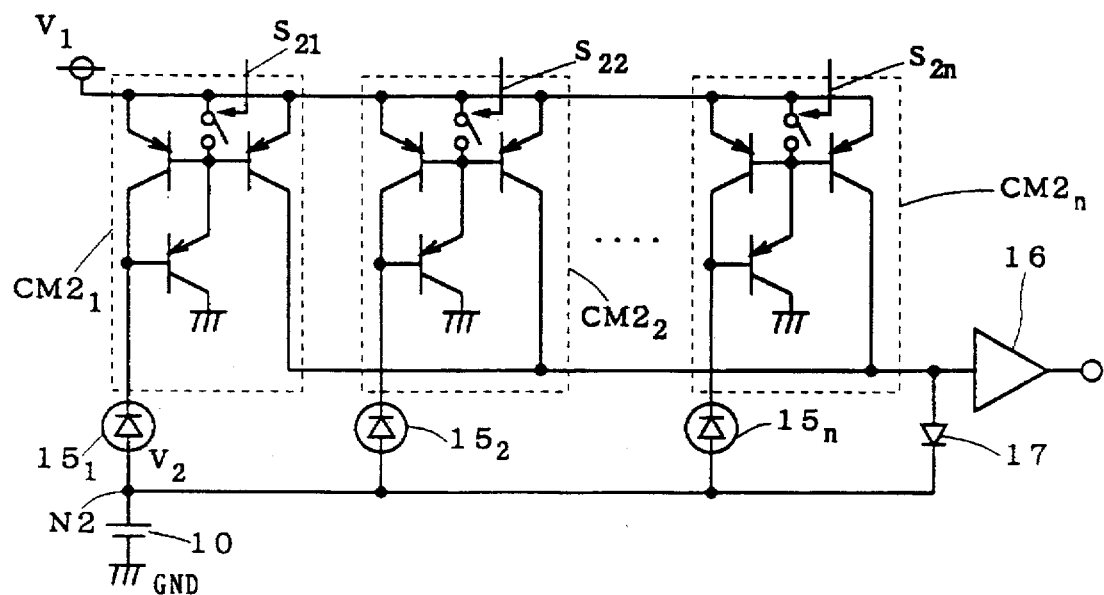
FIG. 3 is a circuit diagram showing a second mode of first preferred embodiment of a luminance detecting circuit of the invention.

A second mode of first preferred embodiment of the invention is shown in FIG. 3. FIG. 3 is a circuit diagram showing a constitution of the luminance detecting circuit of the second mode. In FIG. 3, reference numeral $15_i$ is an SPD having a cathode and an anode connected to a node N2, $CM2_i$ is a current mirror circuit having an output terminal and an input terminal connected to the cathode of the SPD $15_i$, 16 is a buffer amplifier having an input terminal connected commonly to the output terminals of the current mirror circuits $CM2_1$ to $CM2_n$ and an output terminal for outputting the input voltage from the input terminal by impedance conversion, and 17 is a diode having an anode connected to the input terminal of the buffer amplifier 16 and a cathode connected to the node N2. The voltage of the node N2 is set at a second voltage $V_2$ by means of a power source. The current mirror circuit $CM2_i$ is composed same as the current mirror circuit $CM1_i$ shown in FIG. 2 by using three PNP transistors.

What the second mode of first preferred embodiment differs from the first mode of first preferred embodiment lies in the constitution of the current-voltage converting means. In the second mode, instead of the operational amplifier, the buffer amplifier 16 is used. Same as in the first mode, the currents amplified by the current mirror circuits $CM2_1$ to $CM2_n$ flow in the diode 17. Across both ends of the diode 17, a voltage $V_{be}$ having a value equal to the logarithm of the sum of the currents $I_{21}$ to $I_{2n}$ is generated, and a voltage got by adding the voltage across both ends of the diode 17 to the second voltage $V_2$ is put into the input terminal of the buffer amplifier 16, and is put out of the output terminal of the buffer amplifier 16.

The current is thus converted into a voltage, and the voltage drop is determined in the diode 17, and the luminance is detected.

Same as in the first mode, by using the current mirror circuits $CM2_1$ to $CM2_n$ capable of controlling on/off, the buffer amplifier 16 and diode 17 for composing the current-voltage converting means can be shared in a multi-division sensor. Accordingly, the circuit scale of the luminance detecting circuit can be reduced, and the chip size can be reduced, so that the cost may be curtailed.

Figure 4:
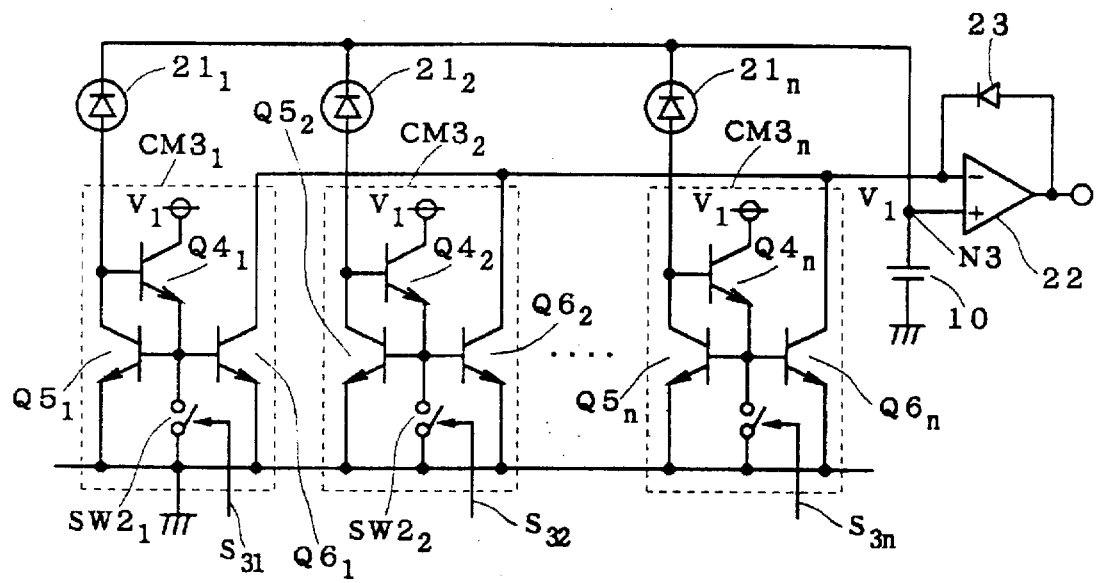
FIG. 4 is a circuit diagram showing a third mode of first preferred embodiment of a luminance detecting circuit of the invention.

A third mode of first preferred embodiment of the invention is described by reference to FIG. 4. FIG. 4 is a circuit diagram showing a constitution of the luminance detecting circuit of the third mode. In FIG. 4, reference numeral $21_i$ is an SPD having an anode and a cathode connected to a node N3, $Q4_i$ is an NPN transistor having an emitter, a collector to be provided with a first voltage $V_1$, and a base connected to the anode of the SPD $21_i$, $Q5_i$ is an NPN transistor having a collector connected to the anode of the SPD $21_i$, an emitter to be provided with a ground voltage, and a base connected to the emitter of the transistor $Q4_i$, $Q6_i$ is an NPN transistor having a collector, a base connected to the base of the transistor $Q5_i$, and an emitter to be provided with a ground voltage, 22 is an operational amplifier having a non-inverting input terminal connected to the node N3, an inverting input terminal connected to the transistors $Q6_1$ to $Q6_n$, and an output terminal for outputting the potential difference between its inverting input terminal and its non-inverting input terminal, and 23 is a diode connected between the anode connected to the output terminal of the operational amplifier 22 and the inverting input terminal of the operational amplifier 22.

A current mirror circuit $CM3_i$ is composed of three transistors $Q4_i$, $Q5_i$, $Q6_i$, and one switch $SW2_i$ which can be controlled by a control signal $S_{3i}$. The input terminal of this current mirror circuit $CM3_i$ is the collector of the transistor $Q5_i$, and its output terminal is the collector of the transistor $Q6_i$. The current mirror circuit $CM3_i$ is controlled on/off by the control signal $S_{3i}$, and the output current is zero in OFF state.

Whereas the current mirror circuit $CM1_i$ in the first mode of first preferred embodiment is composed of PNP transistors, in the third mode, the current mirror circuit $CM3_i$ is composed of NPN transistors. Hence, the current flows from the output terminal to the inverting input terminal of the operational amplifier 22. Corresponding to the direction of the current, the direction of the diode is connected also opposite to the first mode, and the anode is connected to the output terminal of the operational amplifier 22. Thus composed third mode has the same effects as the first mode.

Figure 5:
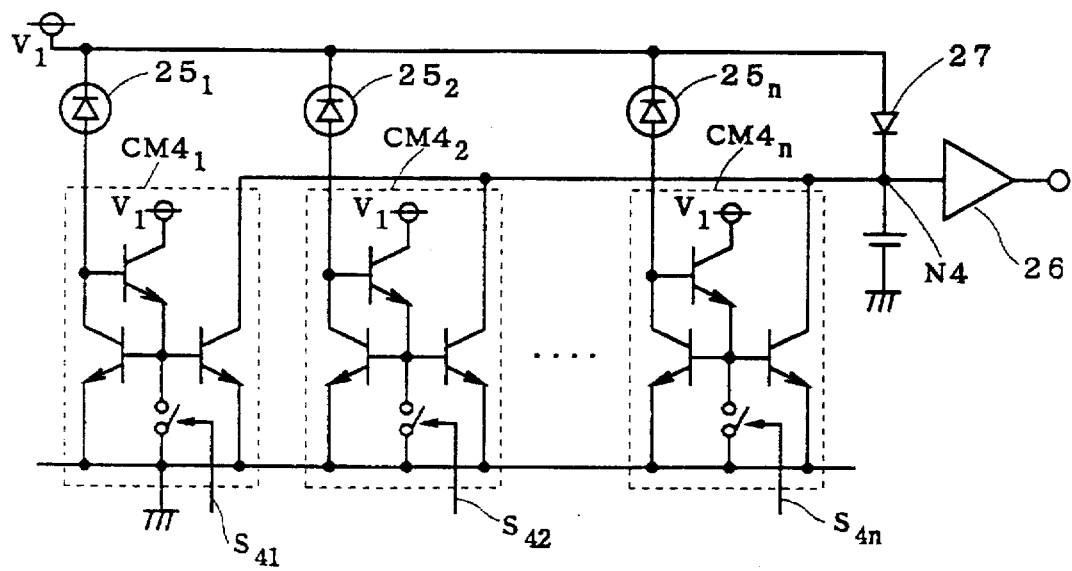
FIG. 5 is a circuit diagram showing a fourth mode of first preferred embodiment of a luminance detecting circuit of the invention.

A fourth mode of first preferred embodiment of the invention is described by reference to FIG. 5. FIG. 5 is a circuit diagram showing a constitution of the luminance detecting circuit of the fourth mode. In FIG. 5, reference numeral $CM4_i$ is a current mirror circuit in a same constitution as in the third mode of first preferred embodiment, for amplifying the input current of the input terminal and putting out of the output terminal, $25_i$ is an SPD having an anode connected to the input terminal of the current mirror circuit $CM4_i$ and a cathode to be provided with a first voltage $V_1$, 26 is a buffer amplifier for outputting the voltage of a node N4 by impedance conversion, and 27 is a diode having an anode connected commonly to the cathodes of the SPDs $25_i$ to $25_n$ and a cathode connected to the node N4, and all output terminals of the current mirror circuits $CM4_1$ to $CM4_n$ are connected to the node N4. The current mirror circuit $CM4_i$ is controlled on/off by the control signal $S_{3i}$, and the output current in OFF state is zero.

Whereas the current mirror circuit $CM2_i$ in the second mode of first preferred embodiment is composed of PNP transistors, in the fourth mode, the current mirror circuit $CM4_i$ is composed of NPN transistors. Hence, the current flows from the input terminal of the buffer amplifier 26 toward the current mirror circuits $CM4_1$ to $CM4_n$. Corresponding to the direction of the current, the direction of the diode is connected also opposite to the second mode, and the cathode of the diode 27 is connected to the input terminal of the buffer amplifier 26. Thus composed fourth mode has the same effects as the second mode.

Figure 6:
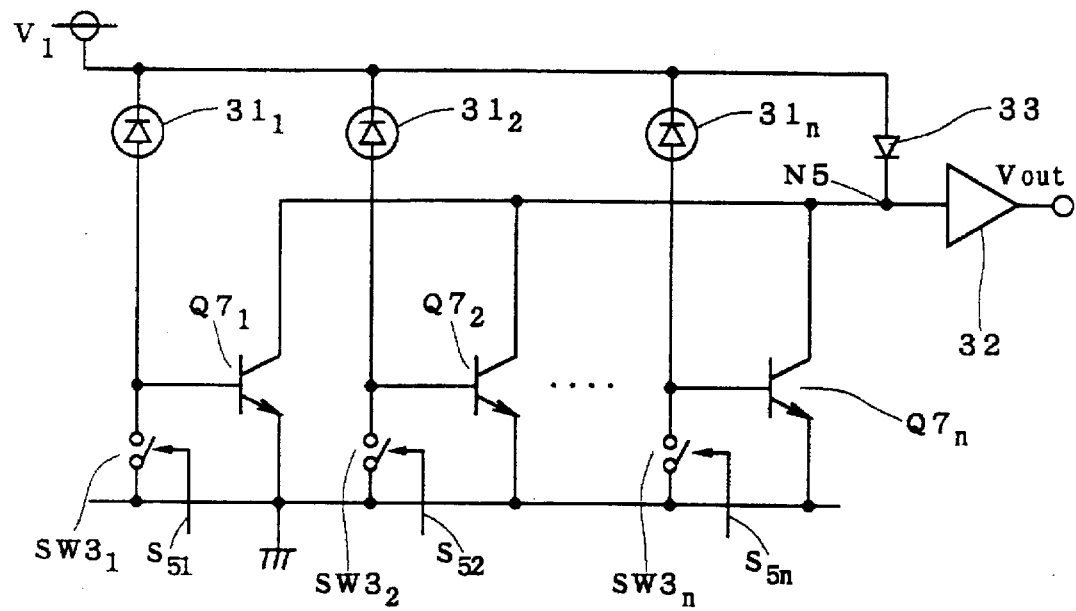
FIG. 6 is a circuit diagram showing a fifth mode of first preferred embodiment of a luminance detecting circuit of the invention.

A fifth mode of first preferred embodiment of the invention is described by reference to FIG. 6. FIG. 6 is a circuit diagram showing a constitution of the luminance detecting circuit of the fifth mode. In FIG. 6, reference numeral $31_i$ is an SPD having an anode and a cathode to be provided with a first voltage $V_1$, $Q7_i$ is an NPN transistor having a collector connected to a node N5, a base connected to the anode of the SPD $31_i$, and an emitter to be provided with a ground voltage, $SW3_i$ is a switch having one end to be provided with a ground voltage and another end connected to the anode of the SPD $31_i$, for controlling on/off by a control signal $S_{5i}$, 33 is a diode having an anode to be provided with a first voltage $V_1$ and a cathode connected to the node N5, and 32 is a buffer amplifier having an input terminal connected to the node N5 and an output terminal for putting out the voltage of the node N5 by impedance conversion.

The transistors $Q7_1$ to $Q7_n$ function as current amplifying means, and they respectively amplify the output photocurrents from the SPDs $31_1$ to $31_n$, and extract a current from one current path connected to the node N5. Generally the current amplification of transistor is about 100 times, and it is a benefit that a larger current amplification is obtained in a smaller circuit scale than when using the current mirror circuit. Since all currents flowing in the transistors $Q7_1$ to $Q7_n$ flow in the diode 33, and hence a voltage drop having a value equal to the logarithm of the current value is generated across both ends of the diode 33. The buffer amplifier 32 outputs a voltage by subtracting the voltage generated across both ends of the diode 33 by the first voltage $V_1$.

By thus converting from current into voltage, a voltage drop by the diode 33 is determined, and the luminance is detected. The transistors $Q7_1$ to $Q7_n$ are controlled on/off by respective control signals $S_{S1}$ to $S_{Sn}$, and by opening the switch only when it is necessary to output the current of the SPD $31_i$, the necessary transistor out of the transistors $Q7_1$ to $Q7_n$ is operated, and an amplified current is outputted. As for the other transistors not required to output current of the transistors $Q7_1$ to $Q7_n$, by closing the switch connected to the base of the unnecessary transistors out of the switches $SW3_1$ to $SW3_n$, the transistors are turned off, and the output current from the transistors is eliminated to zero.

By using the switches $SW3_1$ to $SW3_n$ in the bases of the transistors $Q7_1$ to $Q7_n$, the buffer amplifier 32 and diode 33 for composing the current-voltage converting means can be shared in a multi-division sensor. Accordingly, the circuit scale of the luminance detecting circuit can be reduced, and the chip size can be reduced, so that the cost may be curtailed.

Figure 7:
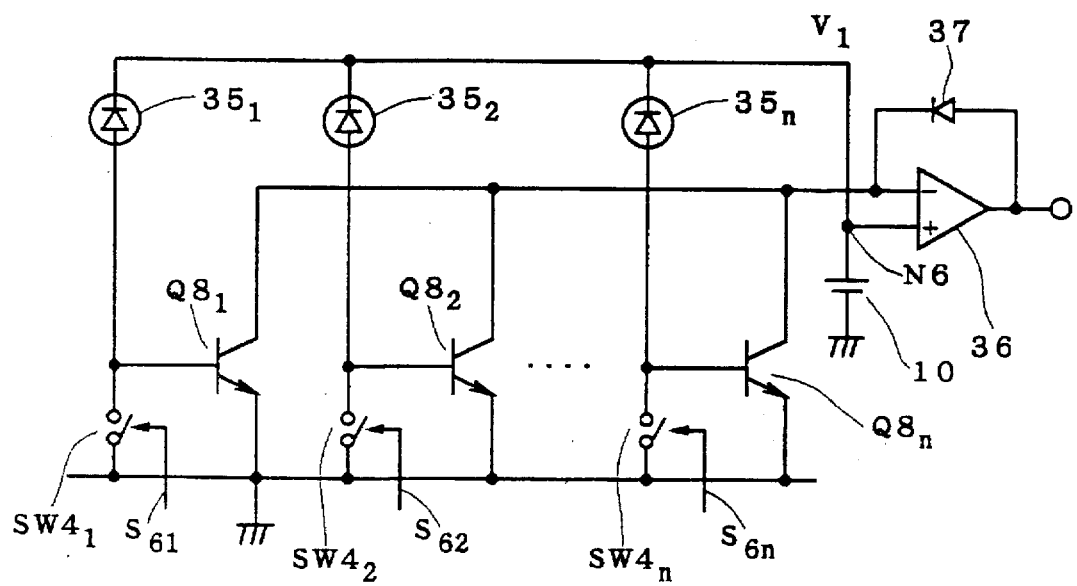
FIG. 7 is a circuit diagram showing a sixth mode of first preferred embodiment of a luminance detecting circuit of the invention.

A sixth mode of first preferred embodiment of the invention is described by reference to FIG. 7. FIG. 7 is a circuit diagram showing a constitution of the luminance detecting circuit of the sixth mode. In FIG. 7, reference numeral $35_i$ is an SPD having an anode and a cathode connected to a node N6, $Q8_i$ is an NPN transistor having a collector, a base connected to the anode of the SPD $35_i$, and an emitter to be provided with a ground potential, $SW4_i$ is a switch having one end to be provided with a ground potential and another end connected to the anode of the SPD $35_i$, for controlling on/off by a control signal $S_{6i}$; 36 is an operational amplifier having a non-inverting input terminal connected to the node N6, an inverting input terminal connected to all collectors of the transistors $Q8_1$ to $Q8_n$, and an output terminal for outputting the potential difference between its inverting input terminal and its non-inverting input terminal, and 37 is a diode having an anode connected to the output terminal of the operational amplifier 36, and a cathode connected to the inverting input terminal.

What the six mode of first preferred embodiment differs from the fifth mode of first preferred embodiment lies in the constitution of the current-voltage converting means. In the sixth mode, instead of the buffer amplifier and the diode connected to its input terminal, the operational amplifier 36 and the diode 37 connected to its output terminal and inverting input terminal are used. Same as in the fifth mode, the currents amplified by the transistors $Q8_1$ to $Q8_n$ flow in the diode 37. Across both ends of the diode 37, a voltage having a value equal to the logarithm of the sum of the transistors $Q8_1$ to $Q8_n$ is generated, and at the output terminal of the operation amplifier 36, a sum voltage of the first voltage $V_1$ and the voltage across both ends of the diodes 37 is outputted. Thus composed sixth mode has the same effects as the fifth mode.

Figure 8:
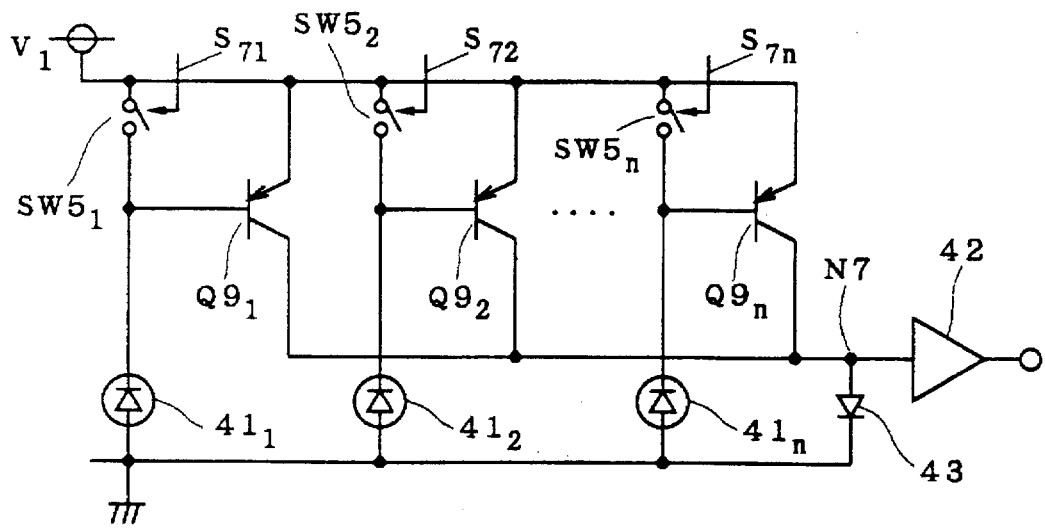
FIG. 8 is a circuit diagram showing a seventh mode of first preferred embodiment of a luminance detecting circuit of the invention.

A seventh mode of first preferred embodiment of the invention is described by reference to FIG. 8. FIG. 8 is a circuit diagram showing a constitution of the luminance detecting circuit of the seventh mode. In FIG. 8, reference numeral $41_i$ is an SPD having a cathode and an anode to be provided with a ground voltage, $Q9_i$ is a PNP transistor having a collector connected to a node N7, a base connected to the cathode of the SPD $41_i$, and an emitter to be provided with a first voltage $V_1$, $SW5_i$ is a switch having one end to be provided with a first voltage $V_1$ and another end connected to the base of the transistor $Q9_i$, 43 is a diode having an anode connected to the node N7 and a cathode to be provided with a ground voltage, and 42 is a buffer amplifier having an input terminal connected to the node N7 and an output terminal for outputting the voltage of its input terminal by impedance conversion.

The switches $SW5_1$ to $SW5_n$ are controlled on/off by a control signal $S_{7i}$ to $S_{7n}$. Of the transistors $Q9_1$ to $Q9_n$, those connected to OFF ones of the switches $SW5_1$ to $SW5_n$ are in OFF state, and the output current of the OFF transistors is zero.

Whereas the current amplifying means of the fifth mode of first preferred embodiment is composed of NPN transistors, in the seventh embodiment, the current amplifying means is composed of PNP transistors. Accordingly, the current flows from the transistors $Q9_1$ to $Q9_n$ toward the node N7. Corresponding to the direction of this current, the direction of the diode is also connected opposite to the fifth mode, and the anode of the diode 43 to be provided with the ground voltage in its cathode is connected to the input terminal of the buffer amplifier 32. Thus composed seventh mode also has the same effects as the fifth mode.

Figure 9:
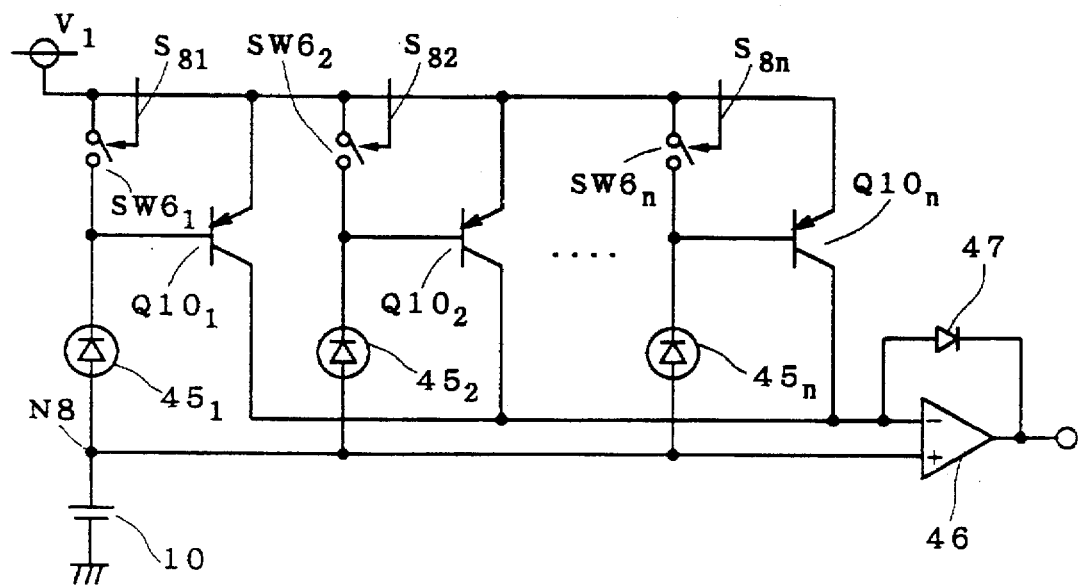
FIG. 9 is a circuit diagram showing an eighth mode of first preferred embodiment of a luminance detecting circuit of the invention.

An eighth mode of first preferred embodiment of the invention is described by reference to FIG. 9. FIG. 9 is a circuit diagram showing a constitution of the luminance detecting circuit of the eighth mode. In FIG. 9, reference numeral $45_i$ is an SPD having a cathode and an anode connected to a node N8, $Q10_i$ is a PNP transistor having a collector, a base connected to the cathode of the SPD $45_i$, and an emitter to be provided with a first voltage $V_1$, $SW6_i$ is a switch having one end to be provided with a first voltage $V_1$ and another end connected to the base of the transistor $Q10_i$, 46 is an operational amplifier having an inverting input terminal connected to all collectors of the transistors $Q10_1$ to $Q10_n$, a non-inverting input terminal connected to the node N8, and an output for outputting a potential difference between its inverting input terminal and its non-inverting input terminal, and 47 is a diode having a cathode connected to the output terminal of the operational amplifier 46, and an anode connected to the non-inverting input terminal of the operational amplifier 46. At the node N8, a second voltage $V_2$ is applied through a reference power source 10. The switches $SW6_1$ to $SW6_n$ are controlled on/off by a control signal $S_{3i}$, and operate same as in the seventh mode.

Whereas the current amplifying means of the sixth mode of first preferred embodiment is composed of NPN transistors, in the eighth embodiment, the current amplifying means is composed of PNP transistors. Accordingly, the current flows from the transistors $Q10_1$ to $Q10_n$ toward the inverting input terminal of the operational amplifier 46. Corresponding to the direction of this current, the direction of the diode 47 is also connected opposite to the sixth mode. Thus composed eighth mode also has the same effects as the sixth mode.

<Second Preferred Embodiment>

Figure 10:
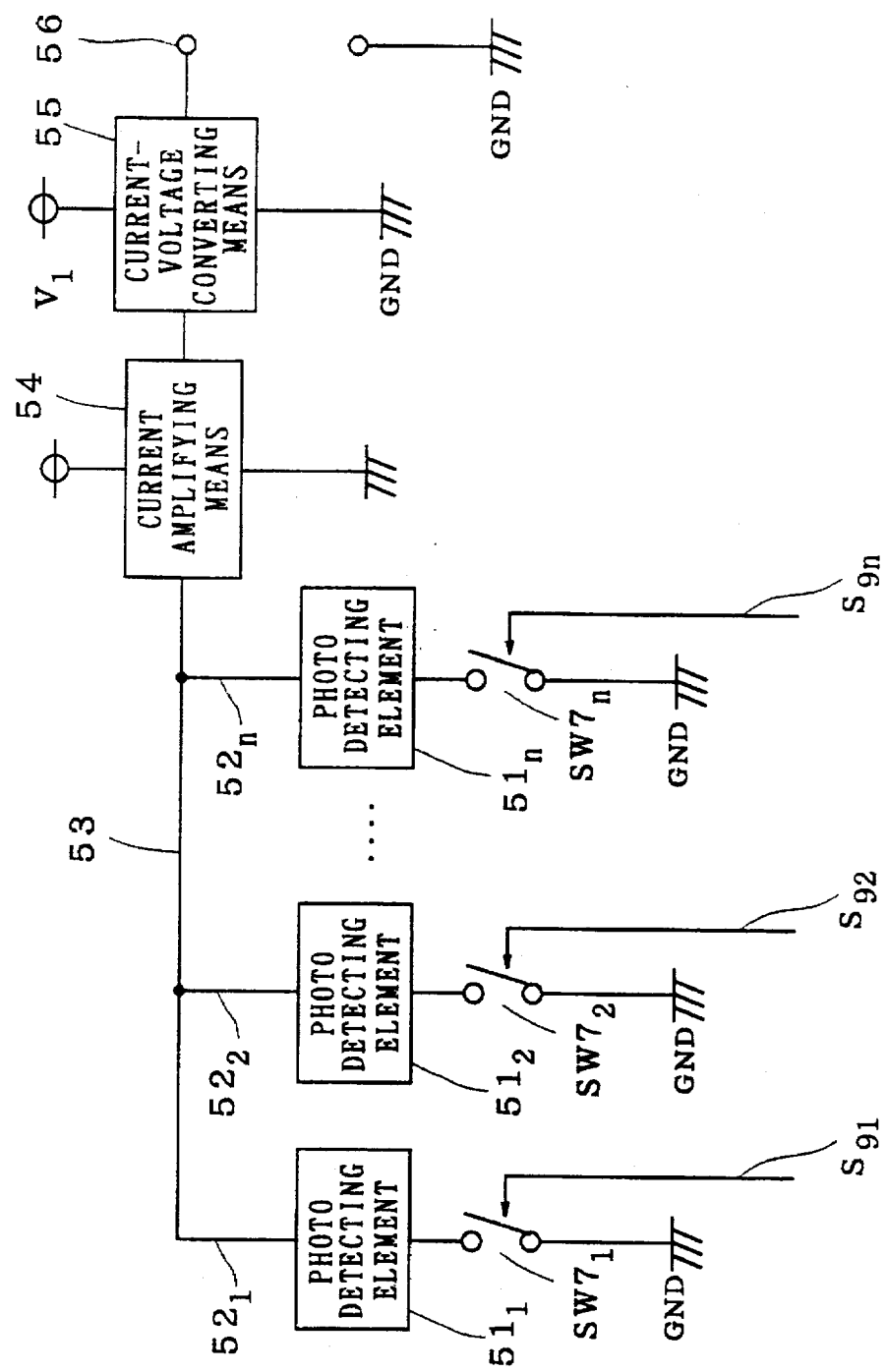
FIG. 10 is a block diagram showing a constitution of second preferred embodiment of a luminance detecting circuit of the invention.

A luminance detecting circuit according to second preferred embodiment of the invention is described below while referring to accompanying drawings. FIG. 10 is a block diagram showing a constitution of the luminance detecting circuit in second preferred embodiment of the invention. In FIG. 10, reference numeral $51_i$ is a photo detecting element disposed in a first current path $52i$, for generating a photocurrent in the first current path $52_i$ by reacting to incident light, $SW7_i$ is switch means disposed in the first current path $52_i$, for controlling on/off of the current flowing from the first current path $52_i$ into a second current path 53, 54 is current amplifying means connected to the second current path 53 and amplifying the current flowing through the second current path 53, and 55 is current-voltage converting means connected to current amplifying means, for converting the current outputted by the current amplifying means 54 into a voltage, and outputting from an output terminal 56.

The current amplifying means 54 amplifies the current of the second current path 53 in which the currents generated in the plurality of photo detecting elements $51_1$ to $51_n$ flow, and therefore the plurality of photo detecting elements $51_1$ to $51_n$ can be handled by one means. Consequently, by one current-voltage converting means 55, the output current of one current amplifying means 54 is converted into a voltage. The photocurrents of the necessary photo detecting elements $51_1$ to $51_n$ are selectively passed into the second current path 53 by switch means $SW7_1$ to $SW7_n$. By supplying the output currents of the photo detecting elements $51_1$ to $51_n$ to the current amplifying means 54 selectively by the switch means $SW7_1$ to $SW7_n$, the current amplifying means 54 and current-voltage converting means 55 can be shared by a plurality of photo detecting elements $51_1$ to $51_n$, and the circuit scale of the luminance detecting circuit can be reduced, the chip size can be reduced, and hence the cost can be curtailed.

Figure 11:
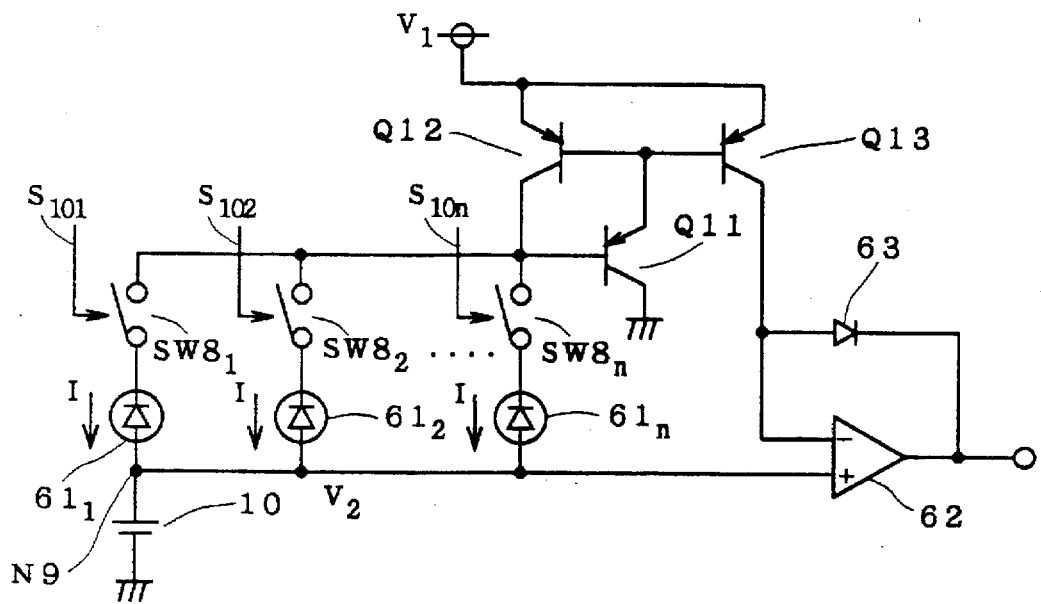
FIG. 11 is a circuit diagram showing a first mode of second preferred embodiment of a luminance detecting circuit of the invention.

A first mode of second preferred embodiment of the invention is described by referring to FIG. 11. FIG. 11 is a circuit diagram showing a constitution of the luminance detecting circuit of this first mode. In FIG. 11, reference numeral $61_i$ is an SPD having a cathode and an anode connected to a node N9, $SW8_i$ is a switch having one end and another end connected to the cathode of the SPD $61_i$, for controlling on/off by a control signal $S_{10i}$, Q11 is a PNP transistor having an emitter, a collector to be provided with a ground voltage, and a base connected to one end of all switches $SW8_1$ to $SW8_n$, Q12 is a PNP transistor having an emitter to be provided with a first voltage $V_1$, a collector connected to the base of the transistor Q11, and a base connected to the emitter of the transistor Q11, Q13 is a PNP transistor having a collector, an emitter to be provided with a first voltage V1, and a base connected to the base of the transistor Q12, 62 is an operational amplifier having a non-inverting input terminal connected to the node N9, an inverting input terminal connected to the collector of the transistor Q13, and an output terminal for outputting a potential difference between its non-inverting input terminal and its inverting input terminal, and 63 is a diode having a cathode connected to the output terminal of the operational amplifier 62, and an anode connected to the inverting input terminal of the operational amplifier 62. The voltage of the node N9 is a second voltage $V_2$ by a reference power source 10.

The transistors Q11 to Q13 compose a current mirror circuit, and the current extracted from the collector of the transistor Q12 is amplified, and outputted from the collector of the transistor Q13. The output current from the transistor Q13 is converted into a voltage by the current-voltage converting means composed of the operational amplifier 62 and the diode 63. The voltage obtained by subtracting the output voltage of the operational amplifier 62 from the second voltage $V_2$ is the voltage generated across both ends of the diode 63, and the luminance can be detected from this voltage. By the switches $SW8_1$ to $SW8_n$, the photocurrents of required ones of the SPDs $61_1$ to $61_n$ can be given to the current mirror circuit. The SPDs $61_1$ to $61_n$ to give currents to the current mirror circuit may be either in plurality or in singularity.

Since the SPDs $61_1$ to $61_n$ are selected by the switches $SW8_1$ to $SW8_n$, the transistors Q11 to Q13 as current amplifying means, the operational amplifier 62 as current-voltage converting means, and diode 63 can be shared by a plurality of SPDs. Accordingly, the circuit scale of the luminance detecting circuit can be reduced, the chip size can be reduced, and hence the cost is curtailed.

Figure 12:
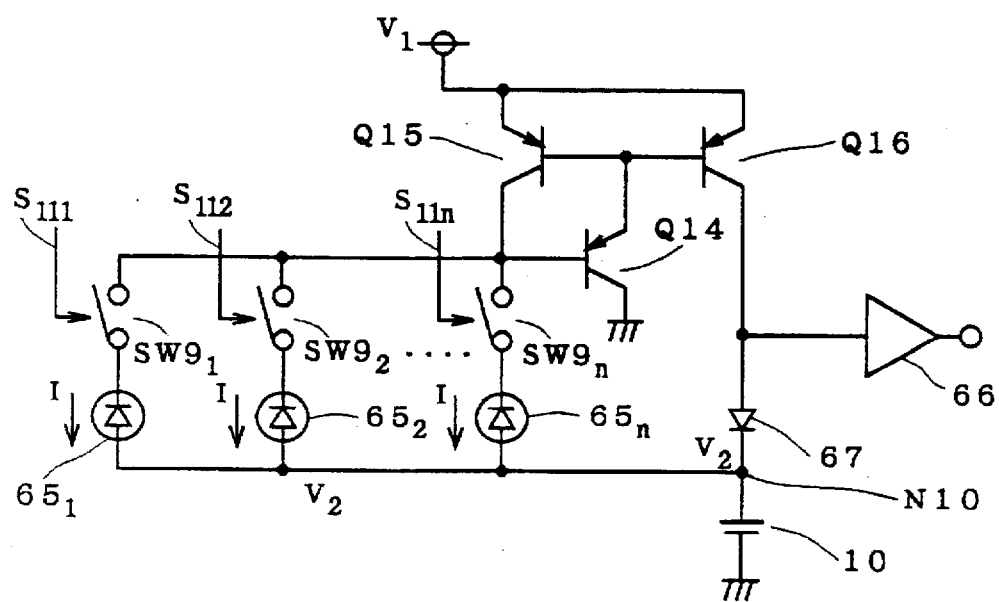
FIG. 12 is a circuit diagram showing a second mode of second preferred embodiment of a luminance detecting circuit of the invention.

A second mode of second preferred embodiment of the invention is described by referring to FIG. 12. FIG. 12 is a circuit diagram showing a constitution of the luminance detecting circuit of the second mode. In FIG. 12, reference numeral $65_i$ is an SPD having a cathode and an anode connected to a node N10, $SW9_i$ is a switch having one end and another end connected to the cathode of the SPD $65_i$, for controlling on/off by a control signal $S_{11i}$, Q14 is a PNP transistor having an emitter, a collector to be provided with a ground voltage, and a base connected to one end of all switches $SW9_1$ to $SW9_n$, Q15 is a PNP transistor having an emitter to be provided with a first voltage $V_1$, a collector connected to the base of the transistor Q14, and a base connected to the emitter of the transistor Q14, Q16 is a PNP transistor having a collector, an emitter to be provided with a first voltage $V_1$, and a base connected to the base of the transistor Q15, 66 is a buffer amplifier having an input terminal connected to the collector of the transistor Q16, and an output terminal for outputting the voltage of its input terminal by impedance conversion, and 67 is a diode having an anode connected to the input terminal of the buffer amplifier 66 and a cathode connected to the node N10. The voltage of the node N10 is a second voltage $V_2$ by a reference power source 10.

What the second mode of second preferred embodiment differs from the first mode of second preferred embodiment lies in the constitution of the current-voltage converting means. In the second mode, instead of the operational amplifier, the buffer amplifier 66 is used. Same as in the first mode, the currents amplified by the current mirror circuits flow in the diode 67. Across both ends of the diode 67, a voltage having a value equal to the logarithm of the sum of the currents outputted by the SPDs $65_1$ to $65_n$ is generated, and a voltage obtained by adding the voltage across both ends of the diode 67 to the second voltage $V_2$ is put into the input terminal of the buffer amplifier 66, and is put out of the output terminal of the buffer amplifier 66. Thus composed second mode has same effects as the first mode.

Figure 13:
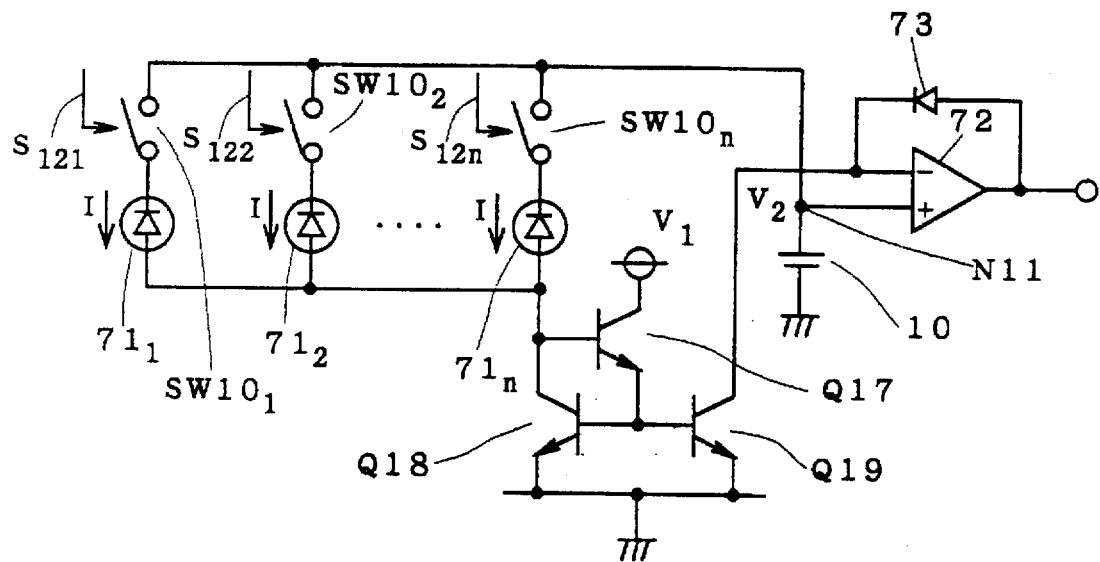
FIG. 13 is a circuit diagram showing a third mode of second preferred embodiment of a luminance detecting circuit of the invention.

A third mode of second preferred embodiment of the invention is described by referring to FIG. 13. FIG. 13 is a circuit diagram showing a constitution of the luminance detecting circuit of the third mode. In FIG. 13, reference numeral $SW10_i$ is a switch having one end connected to a node N11 and another end, for controlling on/off by a control signal $S_{12i}$, $71_i$ is an SPD having an anode and a cathode connected to another end of the switch $SW10_i$, Q17 is an NPN transistor having an emitter, a collector to be provided with a first voltage $V_1$, and a base connected to the one ends of all of SPDs $71_1$ to $71_n$, Q18 is an NPN transistor having an emitter to be provided with a ground voltage, a collector connected to the base of the transistor Q17, and a base connected to the emitter of the transistor Q17, Q19 is an NPN transistor having a collector, an emitter to be provided with a ground voltage, and a base connected to the base of the transistor Q18, 72 is an operational amplifier having a inverting input terminal connected to the collector of the transistor Q19, a non-inverting input terminal connected to the node N11, and an output terminal for outputting the potential difference between its inverting input terminal and its non-inverting input terminal, and 73 is a diode having an anode connected to the output terminal of the operational amplifier 72 and a cathode connected to the inverting input terminal of the operational amplifier 72. The voltage of the node N11 is a second voltage $V_2$ by a reference power source 10.

Whereas the current mirror circuit in the first mode of second preferred embodiment is composed of PNP transistors, in the third mode, the current mirror circuit is composed of NPN transistors. Hence, the current flows from the output terminal to the inverting input terminal of the operational amplifier 72. Corresponding to the direction of the current, the direction of the diode is connected also opposite to the first mode, and the anode is connected to the output terminal of the operational amplifier 72. Thus composed third mode has the same effects as the first mode.

Figure 14:
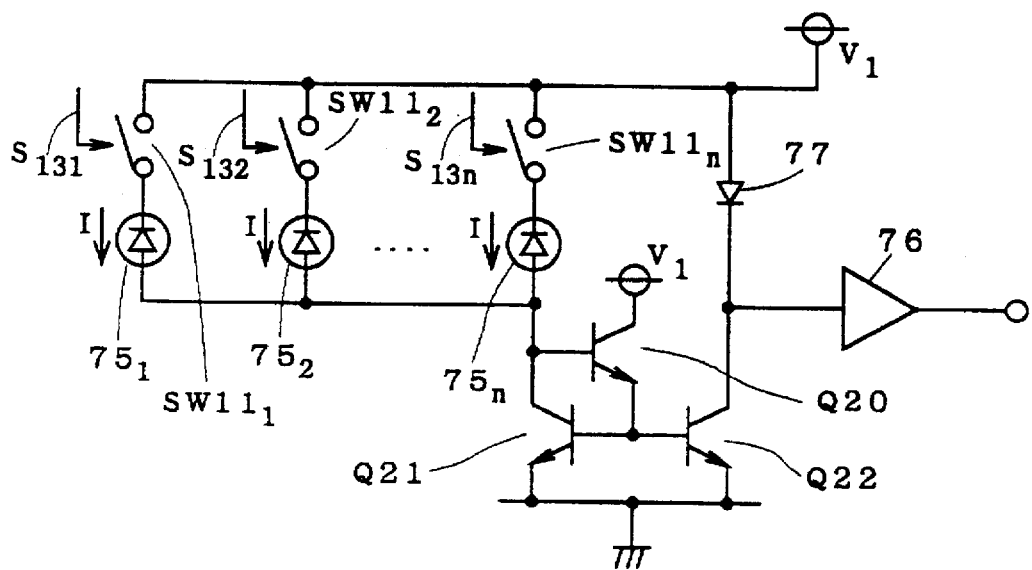
FIG. 14 is a circuit diagram showing a fourth mode of second preferred embodiment of a luminance detecting circuit of the invention.

A fourth mode of second preferred embodiment of the invention is described by reference to FIG. 14. FIG. 14 is a circuit diagram showing a constitution of the luminance detecting circuit of the fourth mode. In FIG. 14, reference numeral $SW11_i$ is a switch having one end to be provided with a first voltage $V_1$ and another end, for controlling on/off by a control signal $S_{13i}$, $75_i$ is an SPD having a cathode connected to another end of the switch $SW11_i$ and an anode, Q20 is an NPN transistor having an emitter, a collector to be provided with a first voltage $V_1$, and a base connected to all anodes of the SPDs $75_1$ to $75_n$, Q21 is an NPN transistor having an emitter to be provided with a ground voltage, a collector connected to the base of the transistor Q20, and a base connected to the emitter of the transistor Q20, Q22 is an NPN transistor having a collector, an emitter to be provided with a ground voltage, and a base connected to the base of the transistor Q21, 76 is a buffer amplifier having an input terminal connected to the collector of the transistor Q22, and an output terminal for outputting the voltage of the input terminal by impedance conversion, and 77 is a diode having a cathode connected to the input terminal of the buffer amplifier 76, and an anode to be provided with a first voltage.

What the fourth mode of second preferred embodiment differs from the third mode of second preferred embodiment lies in the constitution of the current-voltage converting means. In the fourth mode, instead of the operational amplifier, the buffer amplifier 76 is used. Same as in the third mode, the current amplified by the current mirror circuit flows in the diode 77. Across both ends of the diode 77, a voltage having a value equal to the logarithm of the sum of the currents outputted by the SPDs $75_1$ to $75_n$ is generated, and at the input terminal of the buffer amplifier 76, a voltage obtained by subtracting the voltage drop across both ends of the diode 77 from the first voltage $V_1$ is put in, and is put out from the output terminal of the buffer amplifier 76. Thus composed fourth mode has same effects as the third mode.

Figure 15:
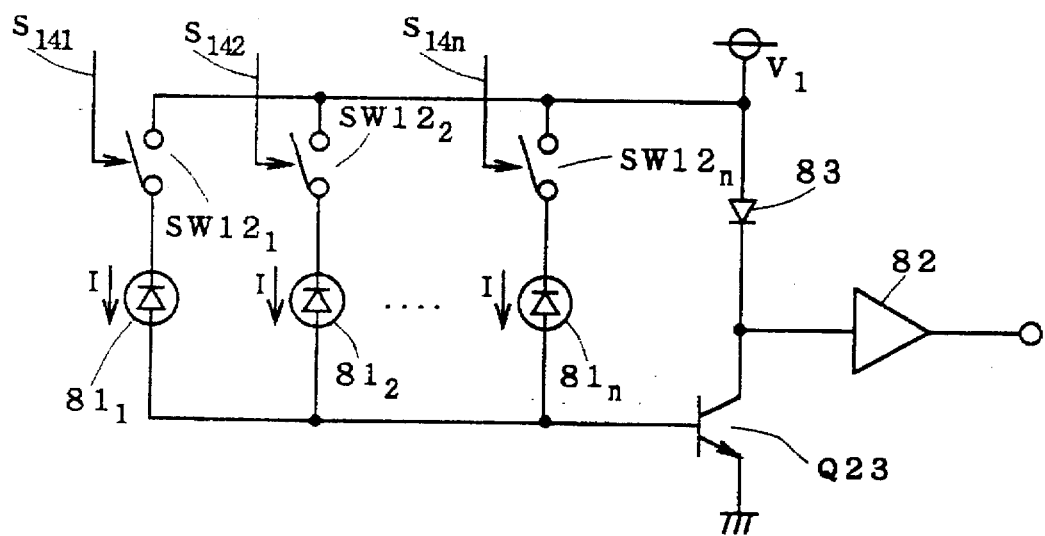
FIG. 15 is a circuit diagram showing a fifth mode of second preferred embodiment of a luminance detecting circuit of the invention.

A fifth mode of second preferred embodiment of the invention is described by reference to FIG. 15. FIG. 15 is a circuit diagram showing a constitution of the luminance detecting circuit of the fifth mode. In FIG. 15, reference numeral $SW12_i$ is a switch having one end to be provided with a first voltage $V_1$ and other end, for controlling on/off by a control signal $S_{14i}$, $81_i$ is an SPD having a cathode connected to the other end of the switch $SW12_i$ and an anode, Q23 is an NPN transistor having a collector, an emitter to be provided with a ground voltage, and a base connected to all anodes of the SPDs $81_1$ to $81_n$, 82 is a buffer amplifier having an input terminal connected to the collector of the transistor Q23 and an output terminal for outputting the voltage of the input terminal by impedance conversion, and 83 is a diode having a cathode connected to the input terminal of the buffer amplifier 82, and an anode connected to other end of the switches $SW12_1$ to $SW12_n$.

What the fifth mode of second preferred embodiment differs from the fourth mode of second preferred embodiment lies in the constitution of the current amplifying means. In the fifth mode, as the current amplifying means, instead of the current mirror circuit, the NPN transistor Q23 is used. Same as in the fourth mode, the current amplified by the transistor Q23 flows in the diode 83. Across both ends of the diode 83, a voltage having a value equal to the logarithm of the sum of the currents outputted by the SPDs $81_1$ to $81_n$ is generated, and at the input terminal of the buffer amplifier 82, a voltage subtracting the voltage at both ends of the diode 83 from the first voltage $V_1$ is put in, and is put out of the output terminal of the buffer amplifier 82. Thus composed fifth mode also has the same effects as the fourth mode.

Figure 16:
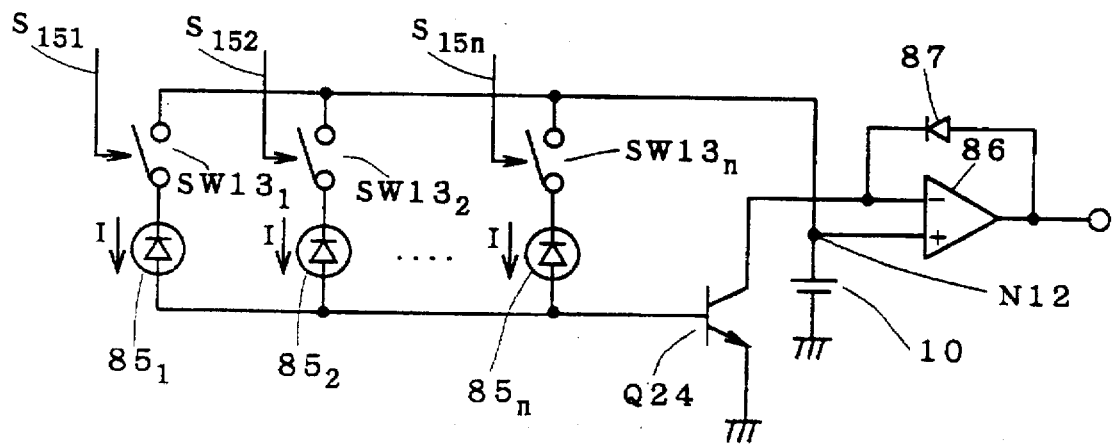
FIG. 16 is a circuit diagram showing a sixth mode of second preferred embodiment of a luminance detecting circuit of the invention.

A sixth mode of second preferred embodiment of the invention is described by reference to FIG. 16. FIG. 16 is a circuit diagram showing a constitution of the luminance detecting circuit of the sixth mode. In FIG. 16, reference numeral $SW13_i$ is a switch having one end connected to a node N12 and other end, for controlling on/off by a control signal $S15_i$, $85_i$ is an SPD having a cathode connected to the other end of the switch $SW13_i$ and an anode, Q24 is an NPN transistor having a collector, an emitter to be provided with a ground voltage, and a base connected to all anodes of the SPDs $85_1$ to $85_n$, 86 is an operational amplifier having an inverting input terminal connected to the collector of the transistor Q24 and an output terminal for outputting the voltage of the input terminal, and 87 is a diode having a cathode connected to the input terminal of the operation amplifier 86, and an anode connected to output terminal of the operational amplifier 86. The voltage of the node N12 is a first voltage $V_1$ by a reference power source 10.

What the sixth mode of second preferred embodiment differs from the fifth mode of second preferred embodiment lies in the constitution of the current-voltage converting means. In the sixth mode, instead of the buffer amplifier and diode connected to its input terminal, the operational amplifier 86 and the diode 87 connected between its output terminal and inverting input terminal are used. Same as in the fifth mode, the current amplified by the transistor Q24 flows in the diode 87. Across both ends of the diode 87, a voltage having a value equal to the logarithm of the sum of the transistors $Q8_1$ to $Q8_n$ is generated, and at the output terminal of the operational amplifier 86, a voltage obtained by adding the voltage across both ends of the diode 87 to the first voltage $V_1$ is put out. Thus composed sixth mode also has the same effects as the fifth mode.

Figure 17:
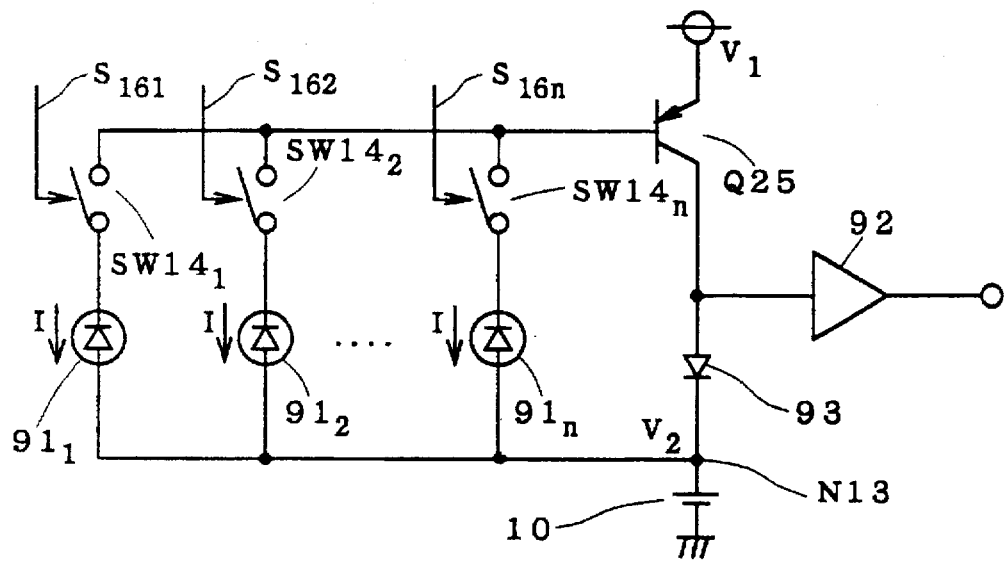
FIG. 17 is a circuit diagram showing a seventh mode of second preferred embodiment of a luminance detecting circuit of the invention.

A seventh mode of second preferred embodiment of the invention is described by reference to FIG. 17. FIG. 17 is a circuit diagram showing a constitution of the luminance detecting circuit of the seventh mode. In FIG. 17, reference numeral $91_i$ is an SPD having an anode connected to a node N13 and a cathode, $SW14_i$ is a switch having one end connected to the cathode of the SPD91$_i$ and another end, for controlling on/off by a control signal S$_{16i}$, Q25 is a PNP transistor having a collector, an emitter to be provided with a first voltage V$_1$, and a base connected to all other ends of the switch SW14$_i$, 92 is a buffer amplifier having an input terminal connected to the collector of the transistor Q25 and an output terminal for outputting the voltage of the input terminal by impedance conversion, and 93 is a diode having an anode connected to the input terminal of the buffer amplifier 92 and a cathode connected to the anode of the SPD 91$_i$.

Whereas the current amplifying means of the fifth mode of second preferred embodiment is composed of NPN transistors, in the seventh embodiment, the current amplifying means is composed of PNP transistors. Accordingly, the current flows from the transistor Q25 toward the node N13. Corresponding to the direction of this current, the direction of the diode is also connected opposite to the fifth mode, and the anode of the diode 93 to be provided with the first voltage V$_1$ in the cathode is connected to the input terminal of the buffer amplifier 92. Thus composed seventh mode also has the same effects as the fifth mode.

Figure 18:
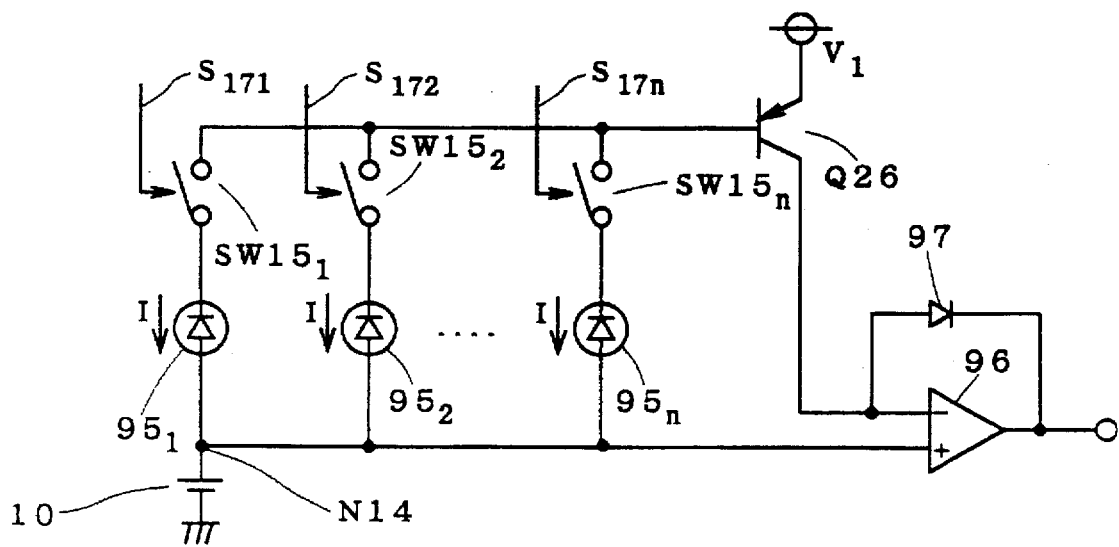
FIG. 18 is a circuit diagram showing an eighth mode of second preferred embodiment of a luminance detecting circuit of the invention.

An eighth mode of second preferred embodiment of the invention is described by reference to FIG. 18. FIG. 18 is a circuit diagram showing a constitution of the luminance detecting circuit of the eighth mode. In FIG. 18, reference numeral 95$_i$ is an SPD having an anode connected to a node N14 and a cathode, SW15$_i$ is a switch having one end connected to the cathode of the SPD 95$_i$ and another end, for controlling on/off by a control signal S$_{17i}$, Q26 is a PNP transistor having a collector, an emitter to be provided with a first voltage V$_1$, and a base connected to all another ends of the switches SW15$_1$ to SW15$_n$, 96 is an operational amplifier having an inverting input terminal connected to the collector of the transistor Q26, a non-inverting input terminal connected to the node N14, and an output for outputting a potential difference between its inverting input terminal and its non-inverting input terminal, and 97 is a diode having an anode connected to the inverting input terminal of the operational amplifier 96 and a cathode connected to the output terminal of the operational amplifier 96.

Whereas the current amplifying means of the sixth mode of second preferred embodiment is composed of NPN transistors, in the eighth embodiment, the current amplifying means is composed of PNP transistors. Accordingly, the current flows from the transistor Q26 toward the anode of the diode 97. Corresponding to the direction of this current, the direction of the diode 97 is also connected opposite to the sixth mode, and the cathode of the diode 97 is connected to the output terminal of the operational amplifier 96. Thus composed eighth mode also has the same effects as the sixth mode.

<Third Preferred Embodiment>

Figure 19:
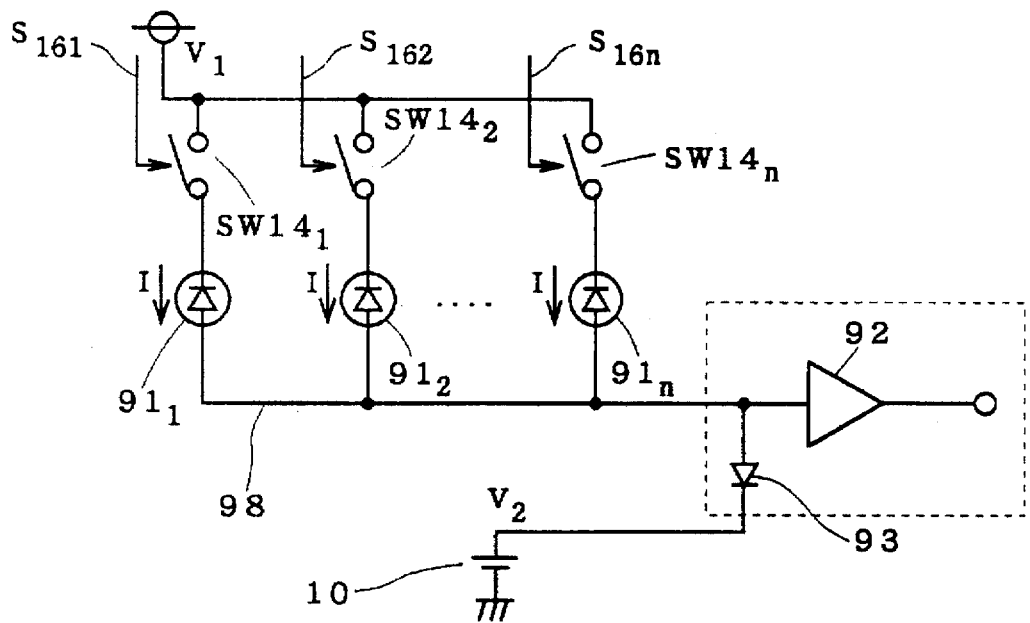
FIG. 19 is a circuit diagram showing a first mode of third preferred embodiment of a luminance detecting circuit of the invention.

A luminance detecting circuit according to a first mode of third preferred embodiment of the invention is described below while referring to FIG. 19. FIG. 19 is a circuit diagram showing a constitution of the luminance detecting circuit of the first mode. In FIG. 19, reference numeral SW14$_i$ is a switch having one end to be provided with a first voltage V$_1$ and other end, for controlling on/off by a control signal S16$_i$, 91$_i$ is an SPD having an anode and a cathode connected to the other ends of the SW14$_1$ to 14$_n$, 92 is a buffer amplifier having an input terminal connected to all anodes of a plurality of SPDs 91$_1$ to 91$_n$, and an output terminal for outputting the voltage of the input terminal by impedance conversion, and 93 is a diode having a cathode to be provided with a second voltage V$_2$ by a reference power source 10, and an anode connected to the input terminal of the buffer amplifier 92.

All output currents from the SPDs 91$_1$ to 91$_n$ flow in the diode 93. The current flowing in the diode 93 is converted into a voltage by current-voltage converting means composed of buffer amplifier 92 and diode 93. The voltage obtained by subtracting the output voltage of the buffer amplifier 92 from the second voltage V$_2$ is the voltage generated at both ends of the diode 93, and the luminance can be detected from this voltage. By the switches SW14$_1$ to SW14$_n$, only necessary photocurrents of the SPDs 91$_1$ to 91$_n$ can be given to the diode 93. The SPDs 91$_1$ to 91$_n$ to give currents to the diode 93 may be in plurality or in singularity.

Since the SPDs 91$_1$ to 91$_n$ are selected by the switches SW14$_1$ to SW14$_n$, the buffer amplifier 92 as the current-voltage converting means and the diode 93 can be shared by a plurality of SPDs 91$_1$ to 91$_n$. Accordingly, the circuit scale of the luminance detecting circuit can be reduced, the chip size can be reduced, and hence the cost can be curtailed.

That is, in the luminance detecting circuit of third preferred embodiment, the buffer amplifier 92 and diode 93 as current-voltage converting means convert the current flowing in the second current path 98, out of the photocurrents of all SPDs 91$_1$ to 91$_n$, into a voltage. Of the photocurrents of the SPDs 91$_1$ to 91$_n$ flowing in the second current path 98, only the necessary ones are selected by the switch means SW14$_1$ to SW14$_n$.

Figure 20:
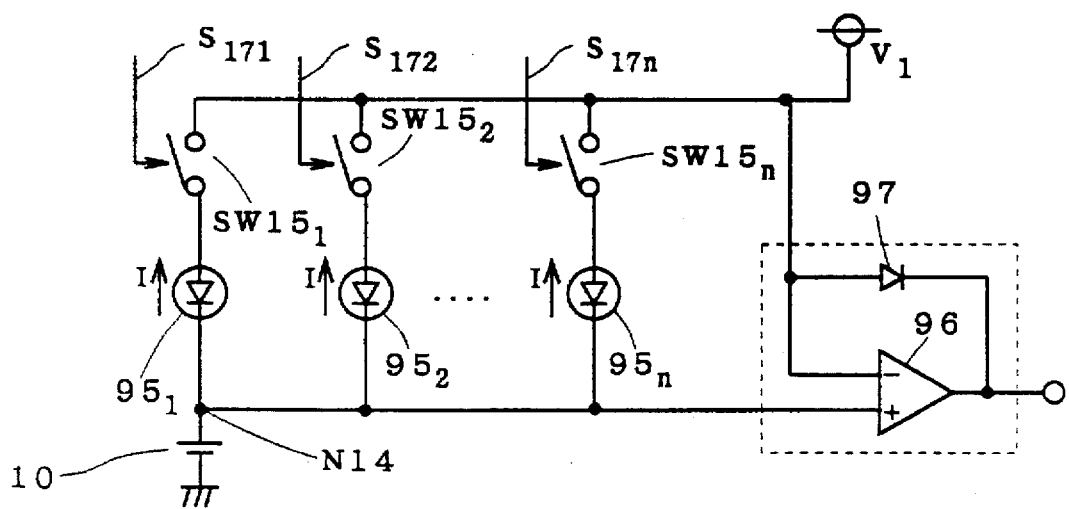
FIG. 20 is a circuit diagram showing a second mode of third preferred embodiment of a luminance detecting circuit of the invention.
Figure 21:
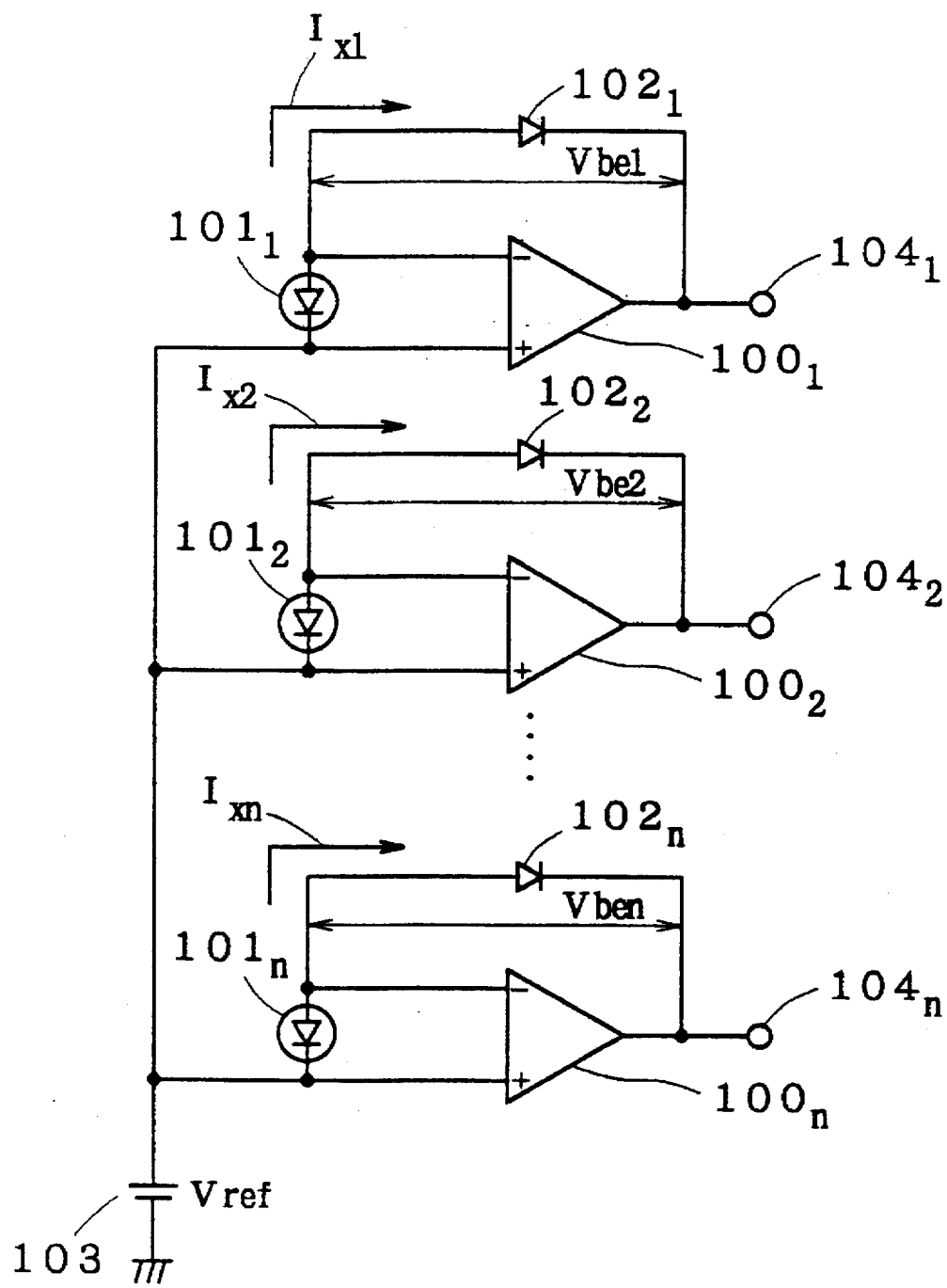
FIG. 21 is a circuit diagram showing a constitution of a conventional luminance detecting circuit.
Figure 22:
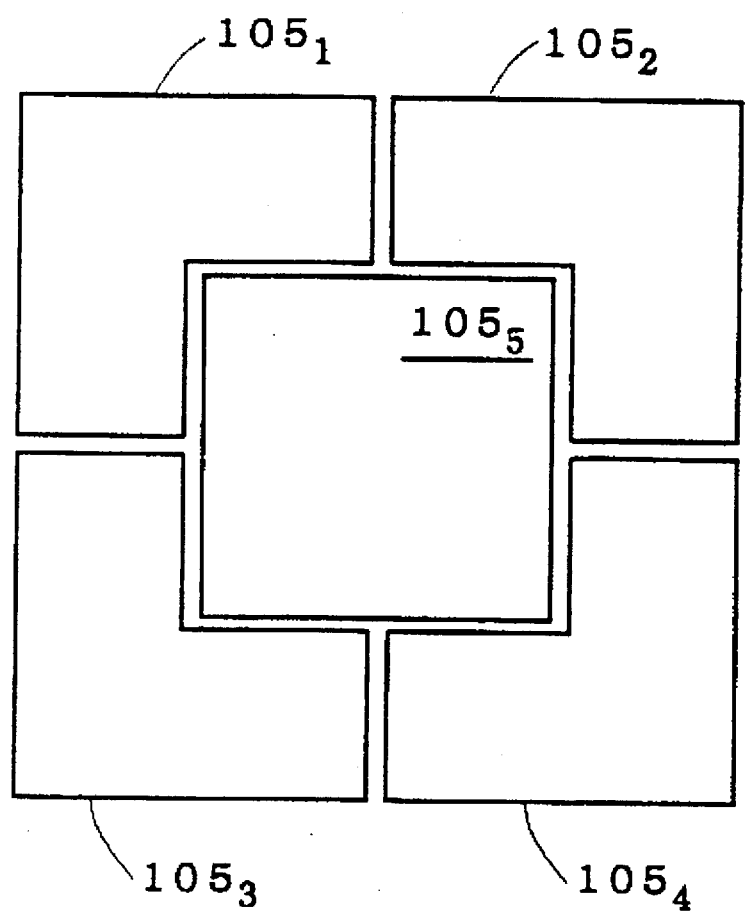
FIG. 22 is a diagram for explaining the receptor unit of a conventional multi-division sensor.

A second mode of third preferred embodiment of the invention is described by reference to FIG. 20. FIG. 20 is a circuit diagram showing a constitution of the luminance detecting circuit of the second mode. In FIG. 20, reference numeral 95$_i$ is an SPD having an anode and a cathode connected to a node N14, SW15$_i$ is a switch having one end to be provided with a first voltage V$_1$ and other end connected to the anode of the SPD 95$_i$, for controlling on/off by a control signal S$_{17i}$, 96 is an operational amplifier having a non-inverting input terminal connected to all cathodes of the SPDs 95$_1$ to 95$_n$, an inverting input terminal connected to one side of all of switches SW15$_1$ to SW15$_n$, and an output terminal for outputting potential difference between its inverting input terminal and its non-inverting input terminal, and 97 is a diode having an anode connected to the inverting input terminal of the operational amplifier 96 and a cathode connected to the output terminal of the operational amplifier 96.

The output currents from the SPDs 95$_1$ to 95$_n$ flow in the diode 97. The current flowing in the diode 97 is converted into a voltage by current-voltage converting means composed of operational amplifier 96 and diode 97. The voltage obtained by subtracting the output voltage of the operational amplifier 96 from the first voltage V$_1$ is the voltage generated across both ends of the diode 97, and the luminance can be detected from this voltage. By turning on or off the switches SW15$_1$ to SW15$_n$, only necessary photocurrents of the SPDs 95$_1$ to 95$_n$ can be given to the diode 97. The SPDs 95$_1$ to 95$_n$ to give currents to the diode 97 may be in plurality or in singularity.

Since the SPDs 95$_1$ to 95$_n$ are selected by the switches SW15$_1$ to SW15$_n$, the operational amplifier 96 as the current-voltage converting means and the diode 97 can be shared by a plurality of SPDs 95$_1$ to 95$_n$. Accordingly, the circuit scale of the luminance detecting circuit can be reduced, the chip size can be reduced, and hence the cost can be curtailed.

While the invention has been shown and described in detail, the foregoing description is in all aspects illustrative and not restrictive. It is therefore understood that numerous modifications and variations can be devised without departing from the scope of the invention.

We claim:

1. A luminance detecting circuit comprising:
   a plurality of first current paths;
   a plurality of photodetecting elements disposed in said plurality of first current paths, respectively, for generating photocurrents in said plurality of first current paths by reacting to incident light;
   a single second current path;
   a plurality of current amplifying means disposed in said plurality of first current paths, respectively, each having an input terminal connected in series to corresponding one of said plurality of photo detecting elements, and an output terminal connected to said second current path, for amplifying said photocurrent generated by corresponding one of said plurality of photo detecting elements, with each of said plurality of current Amplifying means being on/off controlled in response to a control signal, and outputting an amplified current to said second current path; and
   current-voltage converting means connected to said second current path, for converting a current flowing in said second current path into a voltage.

2. A luminance detecting circuit of claim 1, wherein each of said plurality of current amplifying means comprises:
   a first bipolar transistor of a predetermined conductive type having one current electrode to be provided with a predetermined voltage, another current electrode connected to said corresponding photo detecting element, and a control electrode to be provided with a voltage corresponding to said another current electrode;
   a second bipolar transistor of said predetermined conductive type having one current electrode to be provided with said predetermined voltage, another current electrode connected to said second current path, and a control electrode connected to said control electrode of said first bipolar transistor; and
   switch means having one end connected to said control electrode of said first bipolar transistor, and another end to be provided with said predetermined voltage, for being controlled to be in conduction or non-conduction in response to said control signal.

3. A luminance detecting circuit of claim 1, wherein each of said plurality of current amplifying means comprises:
   a bipolar transistor having one current electrode to be provided with a predetermined voltage, a control electrode connected to said corresponding photo detecting element, and another current electrode connected to said second current path; and
   switch means having one end connected to said control electrode and another end to be provided with said predetermined voltage, for being controlled to be in conduction or non-conduction in response to said control signal.

4. A luminance detecting circuit of claim 1, wherein said current-voltage converting means comprises:
   operational amplifying means having a non-inverting input terminal to be provided with a reference voltage, an inverting input terminal connected to said second current path, and an output terminal, for amplifying a difference between a voltage at said non-inverting input terminal and a voltage at said inverting input terminal, and outputting the same from said output terminal; and
   diode means having one end connected to said inverting input terminal of said operational amplifying means, and another end connected to said output terminal of said operational amplifying means.

5. A luminance detecting circuit of claim 1, wherein said current-voltage converting means comprises:
   diode means having one end to be provided with a predetermined voltage, and another end connected to said second current path; and
   a buffer amplifier having an input terminal connected to said second current path, and an output terminal.

6. A luminance detecting circuit comprising:
   a plurality of first current paths;
   a plurality of photo detecting elements disposed in said plurality of first current paths, respectively, for generating photocurrents in said plurality of first current paths by reacting to incident light;
   a single second current path;
   a plurality of switch means each connected to a respective second end of said plurality of first current paths and to said single second current path, each respective switch means controlling on/off of a current flowing into said second current path from a corresponding one of said plurality of first current paths;
   current amplifying means connected to said second current path, for amplifying and outputting a current flowing in said second current path; and
   current-voltage converting means connected to said current amplifying means at a first connection point and connected to a reference voltage at a second connection point for converting the current outputted by said current amplifying means into a luminance voltage;
   wherein,
   said reference voltage is also connected to a first end of each of said plurality of first current paths, and
   said luminance voltage is based on said reference voltage at said second connection point and current at said first connection point.

7. A luminance detecting circuit of claim 6, wherein said current amplifying means comprises:
   a first bipolar transistor of a predetermined conductive type having one current electrode to be provided with a predetermined voltage, another current electrode connected to said second current path, and a control electrode to be provided with a voltage corresponding to said another current electrode; and
   a second bipolar transistor of said predetermined conductive type having one current electrode to be provided with said predetermined voltage, another current electrode connected to said current-voltage converting means, and a control electrode connected to said control electrode of said first bipolar transistor.

8. A luminance detecting circuit of claim 6, wherein said current amplifying means comprises:
   a bipolar transistor having one current electrode to be provided with a predetermined voltage, a control electrode connected to said second current path, and another current electrode connected to said current-voltage converting means at said first connection point.

9. A luminance detecting circuit of claim 6, wherein said current-voltage converting means comprises:
   operational amplifying means having a non-inverting input terminal as said second connection point, an inverting input terminal as said first connection point, and an output terminal, for amplifying a difference between a voltage at said non-inverting input terminal and a voltage at said inverting input terminal, and outputting the same from said output terminal; and diode means having one end connected to said inverting input terminal of said operational amplifying means, and another end connected to said output terminal of said operational amplifying means.

10. A luminance detecting circuit of claim 6, wherein said current-voltage converting means comprises:

diode means having one end to be provided with a predetermined voltage, and another end connected to said current amplifying means; and a buffer amplifier having an input terminal connected to an output terminal of said current amplifying means, and an output terminal.

11. A luminance detecting circuit comprising:

a plurality of photo detecting elements each having an anode and a cathode and disposed in a plurality of first current paths, respectively, for generating photocurrents in said plurality of first current paths by reacting to incident light;

a single second current path;

a plurality of switch means, each having one end connected to a respective anode of said plurality of photodetecting elements and another end directly connected to said second current path, for controlling on/off of currents flowing from said first current paths into said second current path so that only photocurrents of on controlled photodetecting elements are passed to said second current path; and current-voltage converting means connected to said second current path, for converting a current flowing in said second current path into a voltage.

12. A luminance detecting circuit of claim 11, wherein said current-voltage converting means comprises:

operational amplifying means having a non-inverting input terminal to be provided with a reference voltage, an inverting input terminal connected to said second current path, and an output terminal, for amplifying a difference between a voltage at said non-inverting input terminal and a voltage at said inverting input terminal, and outputting the same from said output terminal; and diode means having one end connected to said inverting input terminal of said operational amplifying means, and another end connected to said output terminal of said operational amplifying means.

13. A luminance detecting circuit of claim 11, wherein said current-voltage converting means comprises:

diode means having one end to be provided with a predetermined voltage, and another end connected to said second current path; and a buffer amplifier having an input terminal connected to said second current path, and an output terminal.

* * * * *